US012727322B2

(12) United States Patent
Jung et al.

(10) Patent No.: US 12,727,322 B2
(45) Date of Patent: Sep. 1, 2026

(54) DISPLAY APPARATUS

(71) Applicant: Samsung Display Co., Ltd., Yongin-Si (KR)

(72) Inventors: Sooyoung Jung, Yongin-si (KR); Sungjun Kim, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 623 days.

(21) Appl. No.: 18/090,500

(22) Filed: Dec. 29, 2022

(65) Prior Publication Data

US 2023/0217687 A1 Jul. 6, 2023

(30) Foreign Application Priority Data

Dec. 31, 2021 (KR) ........................ 10-2021-0194550

(51) Int. Cl.
*H10K 50/844* (2023.01)
*H10K 50/858* (2023.01)

(52) U.S. Cl.
CPC ......... *H10K 50/844* (2023.02); *H10K 50/858* (2023.02)

(58) Field of Classification Search
CPC ........................... H10K 50/844; H10K 50/858
See application file for complete search history.

(56) References Cited

U.S. PATENT DOCUMENTS 9,223,171 B2 12/2015 Choi et al.
9,614,180 B2 4/2017 Kang
9,651,829 B2 5/2017 Park
10,439,165 B2 10/2019 Kim et al.
11,196,023 B2 12/2021 Seo et al.
11,367,853 B2 6/2022 Wang et al.
11,943,956 B2 3/2024 Woo et al.
12,150,333 B2 11/2024 Song et al.
2016/0306203 A1 10/2016 Lee et al.
(Continued)

FOREIGN PATENT DOCUMENTS

CN 108461530 A 8/2018
CN 109860411 A 6/2019
(Continued)

OTHER PUBLICATIONS

Jae Bong Lee et al., Spreading and Deposition Characteristics of a Water Droplet Impacting on Hydrophobic Textured Surfaces, Journal of ILASS—Korea 2012, vol. 17 No. 1 pp. 14-19.

*Primary Examiner* — Victor A Mandala
*Assistant Examiner* — Colleen E Snow
(74) *Attorney, Agent, or Firm* — Innovation Counsel LLP

(57) ABSTRACT

Provided is a display apparatus comprising: a display substrate including a substrate and a display element disposed over the substrate; and an encapsulation layer disposed over the display substrate and including an inorganic encapsulation layer and an organic encapsulation layer, the inorganic encapsulation layer shielding the display element, wherein a control groove configured to control a position of an end of the organic encapsulation layer is provided in at least one of the inorganic encapsulation layer and an upper surface of the display substrate, wherein the end of the organic encapsulation layer does not overlap the control groove, or the organic encapsulation layer overlaps only a portion of the control groove.

20 Claims, 26 Drawing Sheets

(56) References Cited

U.S. PATENT DOCUMENTS

| | | | | |
|---|---|---|---|---|
| 2019/0305003 | A1 | 10/2019 | Tan et al. | |
| 2020/0328376 | A1* | 10/2020 | Seo | H10K 59/8731 |
| 2021/0083012 | A1* | 3/2021 | Byun | H10K 59/8731 |
| 2022/0246883 | A1* | 8/2022 | Zhang | H10K 77/111 |

FOREIGN PATENT DOCUMENTS

| | | | |
|---|---|---|---|
| CN | 110970576 | A | 4/2020 |
| KR | 10-2016-0123424 | A | 10/2016 |
| KR | 10-2018-0047295 | A | 5/2018 |
| KR | 10-1942363 | B1 | 4/2019 |
| KR | 10-2054233 | B1 | 12/2019 |
| KR | 10-2080008 | B1 | 2/2020 |
| KR | 10-2020-0120804 | A | 10/2020 |
| KR | 10-2021-0157947 | A | 12/2021 |

* cited by examiner

FIG. 14B

DISPLAY APPARATUS

CROSS-REFERENCE TO RELATED APPLICATION

This application is based on and claims priority under 35 U.S.C. § 119 to Korean Patent Application No. 10-2021-0194550, filed on Dec. 31, 2021, in the Korean Intellectual Property Office, the disclosure of which is incorporated by reference herein in its entirety.

BACKGROUND

1. Field

The present disclosure generally relates to a display apparatus, and more particularly, to a display apparatus and a method of processing fine holes in a layer disposed below an organic encapsulation layer.

2. Description of the Related Art

Mobile electronic apparatuses have been widely used. As mobile electronic apparatuses, not only miniaturized electronic apparatuses, such as mobile phones but also tablet personal computers (PC), have been widely used recently.

To support various functions, for example, to provide a user with visual information, such as images, the mobile electronic apparatuses include a display apparatus. Recently, as the parts driving a display apparatus have been miniaturized, the proportion of the display apparatus in an electronic apparatus has gradually increased and a structure that may be bent to form a preset angle with respect to a flat state is also under development.

SUMMARY

Generally, a display apparatus may include various organic layers. In the case where the upper surface of an organic layer disposed in the upper portion of the organic layers is not flat, a stripe pattern may be viewed while a display apparatus does not operate, or images may distort while the display apparatus operates. One or more embodiments include a display apparatus including a uniform organic layer.

Additional aspects will be set forth in part in the description which follows and, in part, will be apparent from the description, or may be learned by practice of the presented embodiments of the disclosure.

According to one or more embodiments, a display apparatus includes: a display substrate including a substrate and a display element disposed over the substrate, and an encapsulation layer disposed over the display substrate and including an inorganic encapsulation layer and an organic encapsulation layer, the inorganic encapsulation layer shielding the display element, wherein a control groove configured to control a position of an end of the organic encapsulation layer is provided in at least one of the inorganic encapsulation layer and an upper surface of the display substrate, wherein the end of the organic encapsulation layer does not overlap the control groove, or the organic encapsulation layer overlaps only a portion of the control groove.

The control groove may be disposed in an upper surface of at least one of an inorganic layer, an organic layer, and a metal layer of the display substrate.

The control groove may be provided in plurality, and the plurality of control grooves may be arranged to be apart from each other in a first direction and a second direction in a plan view.

The display substrate may further include a dam disposed over the substrate.

One of the control groove and the dam may be disposed inside the other.

A planar shape of the control groove may be one of a circular shape, an elliptical shape, and a polygonal shape.

The control groove may be provided in plurality, and a planar shape of some of the plurality of control grooves may be different from a planar shape of the others of the plurality of control grooves.

The control groove may be provided in plurality, and a lateral surface of some of the plurality of control grooves may be different from a lateral surface of the other control grooves.

A lateral surface of the control groove may be inclined.

A lateral surface of the control groove may have a step difference.

A maximum width of the control groove passing through a center of the control groove may be 100 μm or less.

The control groove may be formed in different layers in a depth direction.

According to one or more embodiments, a display apparatus includes: a substrate; a display element disposed over the substrate, an encapsulation layer disposed on the display element and shielding the display element, a touch layer disposed on the encapsulation layer and receiving an external signal, and a refractive layer disposed on the touch layer and configured to refract light emitted from the display element, wherein a control groove configured to control a position of an end of the refractive layer is provided in an upper surface of the touch layer, and the end of the refractive layer does not overlap the control groove, or the refractive layer overlaps only a portion of the control groove.

The control groove may be provided in plurality, and the plurality of control grooves may be arranged to be apart from each other in a first direction and a second direction in a plan view.

A planar shape of the control groove may be one of a circular shape, an elliptical shape, and a polygonal shape.

The control groove may be provided in plurality, and a planar shape of some of the plurality of control grooves may be different from a planar shape of the others of the plurality of control grooves.

The control groove may be provided in plurality, and a lateral surface of some of the plurality of control grooves may be different from a lateral surface of the others of the plurality of control grooves.

A lateral surface of the control groove may be inclined.

A lateral surface of the control groove may have a step difference.

A maximum width of the control groove passing through a center of the control groove may be 100 μm or less.

These and/or other aspects will become apparent and more readily appreciated from the following detailed description of the embodiments, the accompanying drawings, and claims.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 14A and 14B are schematic cross-sectional views of a display apparatus taken along line A-A' and line B-B' illustrated in FIG. 3 according to another embodiment.

DETAILED DESCRIPTION

Figure 1:
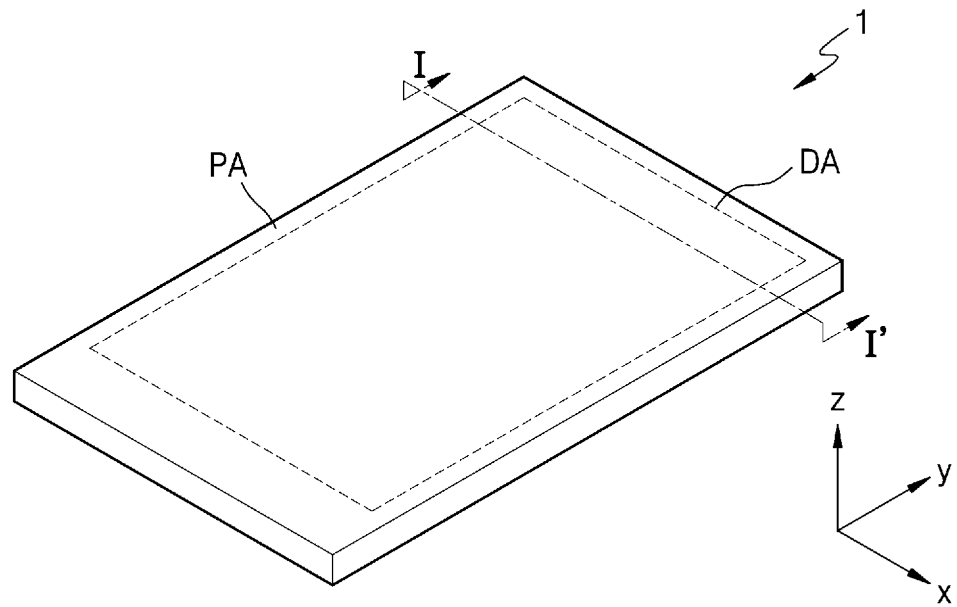
FIG. 1 is a schematic perspective view of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b and c" indicates only a, only b, only c, both a and b, both a and c, both b and c, all of a, b, and c, or variations thereof.

As the present disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described with reference to the accompanying drawings, wherein like reference numerals refer to like elements throughout and a repeated description thereof is omitted.

While such terms as "first" and "second" may be used to describe various components, such components must not be limited to the above terms. The above terms are used to distinguish one component from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or components but do not preclude the addition of one or more other features or components.

It will be further understood that, when a layer, region, or component is referred to as being "on" another layer, region, or component, it can be directly or indirectly on the other layer, region, or component. That is, for example, intervening layers, regions, or components may be present.

Sizes of elements in the drawings may be exaggerated or reduced for convenience of explanation. For example, since sizes and thicknesses of elements in the drawings are arbitrarily illustrated for convenience of explanation, the disclosure is not limited thereto.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

In the case where a certain embodiment may be implemented differently, a specific process order may be performed in the order different from the described order. As an example, two processes that are successively described may be substantially simultaneously performed or performed in the order opposite to the order described.

Figure 2:
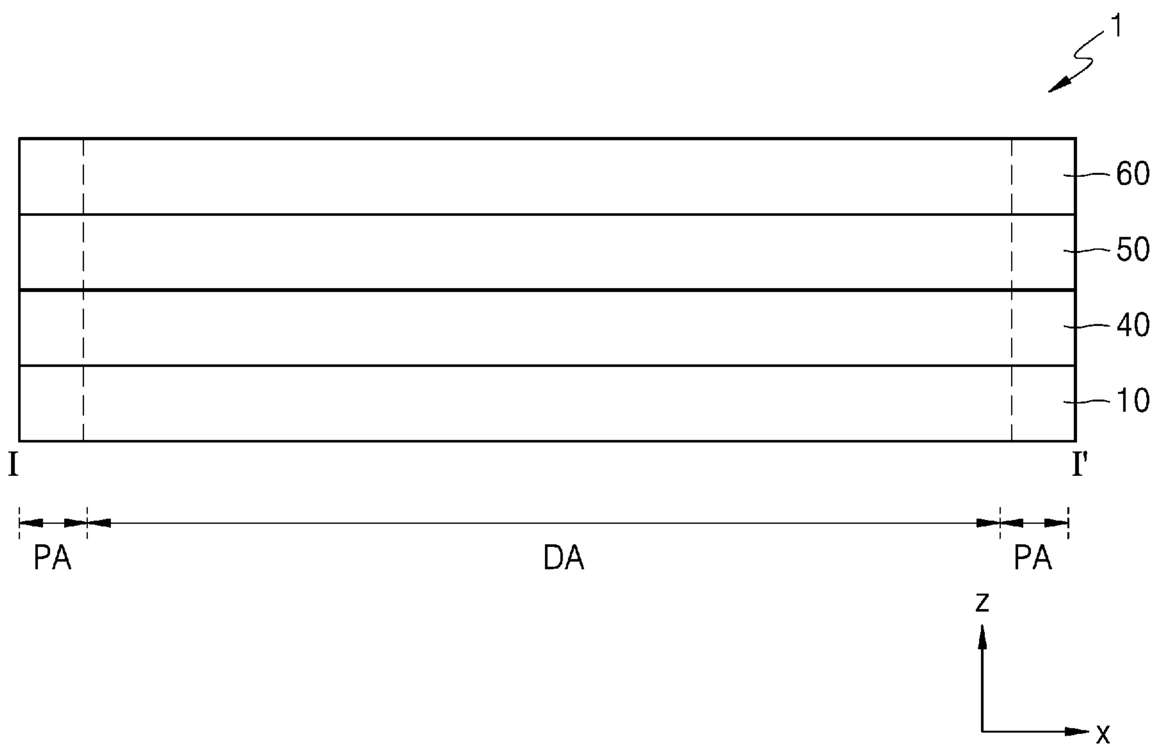
FIG. 2 is a schematic cross-sectional view of a display apparatus according to an embodiment.

FIG. 1 is a schematic perspective view of a display apparatus 1 according to an embodiment. FIG. 2 is a schematic cross-sectional view of the display apparatus 1 according to an embodiment and corresponds to a cross-section of the display apparatus 1, taken along line I-I' of FIG. 1.

Referring to FIGS. 1 and 2, the display apparatus 1 according to embodiments may be implemented as electronic apparatuses, such as smartphones, mobile phones, smartwatches, navigation apparatuses, game consoles, televisions (TVs), head units for automobiles, notebook computers, laptop computers, tablet computers, personal multimedia players (PMPs), personal digital assistants (PDAs), and the like. In addition, electronic apparatuses may be flexible apparatuses.

The display apparatus 1 may include a display area DA and a peripheral area PA around the display area DA. The display apparatus 1 may display images by using light emitted from a plurality of pixels arranged in the display area DA.

The display apparatus 1 may be provided in various shapes, for example, the display apparatus 1 may be provided in a rectangular plate shape having two pairs of sides parallel to each other. In the case where the display apparatus 1 is provided in a rectangular plate shape, one pair of sides of the two pairs of sides may be provided longer than the other pair of sides. In an embodiment, for convenience of description, described is the case where the display apparatus has a rectangular shape having a pair of long sides and a pair of short sides, and an extension direction of the short sides is denoted by a first direction (x-direction), an extension direction of the long sides is denoted by a second direction (y-direction), and a direction perpendicular to the extension directions of the long sides and the short sides is denoted by a third direction (z-direction). In another embodiment, the display apparatus 1 may have a non-quadrangular shape. The non-quadrangular shape may be, for example, a circular shape, an elliptical shape, a polygonal shape including a portion having a circular shape, and a polygon excluding a quadrangle.

In a plan view, the display area DA may be provided in a rectangular shape, as shown in FIG. 1. In another embodiment, the display area DA may be provided in a polygonal shape, such as a triangle, a pentagon, a hexagon, and the like, a circular shape, an elliptical shape, an irregular shape, or the like.

The peripheral area PA is a region arranged around the display area DA and may be a kind of non-display area in which pixels are not arranged. The display area DA may be entirely surrounded by the peripheral area PA. Pads may be arranged in the peripheral area PA, wherein various wirings, a printed circuit board or a driver integrated circuit (IC) chip configured to transfer electric signals to the display area DA are attached to the pads.

Hereinafter, though an organic light-emitting display apparatus is described as an example of the display apparatus 1 according to an embodiment, the display apparatus 1 is not limited thereto. In another embodiment, the display apparatus 1 according to an embodiment may be an inorganic light-emitting display apparatus or a quantum-dot light-emitting display apparatus.

Referring to FIG. 2, the display apparatus 1 may include a display panel 10, and an input sensing layer 40, and an optical functional layer 50 disposed on the display panel 10, and cover member 60 disposed on the optical functional layer 50.

The display panel 10 may be configured to display images. The display panel 10 may include pixels arranged in the display area DA. The pixels may each include a display element. The display element may be connected to a pixel circuit. The display element may include an organic light-emitting element, a quantum-dot organic light-emitting element, or the like.

The input sensing layer 40 may obtain coordinate information corresponding to an external input, for example, a touch event. The input sensing layer 40 may include a sensing electrode (or a touch electrode) and trace lines connected to the sensing electrode. The input sensing layer 40 may be disposed on the display panel 10. The input sensing layer 40 may sense an external input by using a self-capacitance method and/or a mutual capacitance method.

The input sensing layer 40 may be directly formed on the display panel 10, or separately formed and then coupled to the display panel 10 by an adhesive layer, such as an optical clear adhesive. As an example, the input sensing layer 40 may be successively formed after a process of forming the display panel 10. In this case, the input sensing layer 40 may be a portion of the display panel 10, and an adhesive layer may not be disposed between the input sensing layer 40 and the display panel 10. Though it is shown in FIG. 2 that the input sensing layer 40 is disposed between the display panel 10 and the optical functional layer 50, the input sensing layer 40 may be disposed on the optical functional layer 50.

The optical functional layer 50 may include a color-converting layer and an anti-reflection layer. The color-converting layer may be configured to convert light emitted from the display panel 10 to light in a preset wavelength band. In this case, the color-converting layer may include a quantum-dot layer, a light-transmissive layer, and a bank layer. In this case, the bank layer is a layer blocking light and may include a resin including dye and the like. The anti-reflection layer may reduce reflectivity of light (external light) incident toward the display panel 10 from outside. The anti-reflection layer may include a black matrix and color filters. The color filters may be arranged by taking into account colors of pieces of light emitted respectively from the pixels of the display panel 10.

The cover member 60 may protect the display panel 10. The cover member 60 may include a transparent material such as glass or acrylic.

Figure 3:
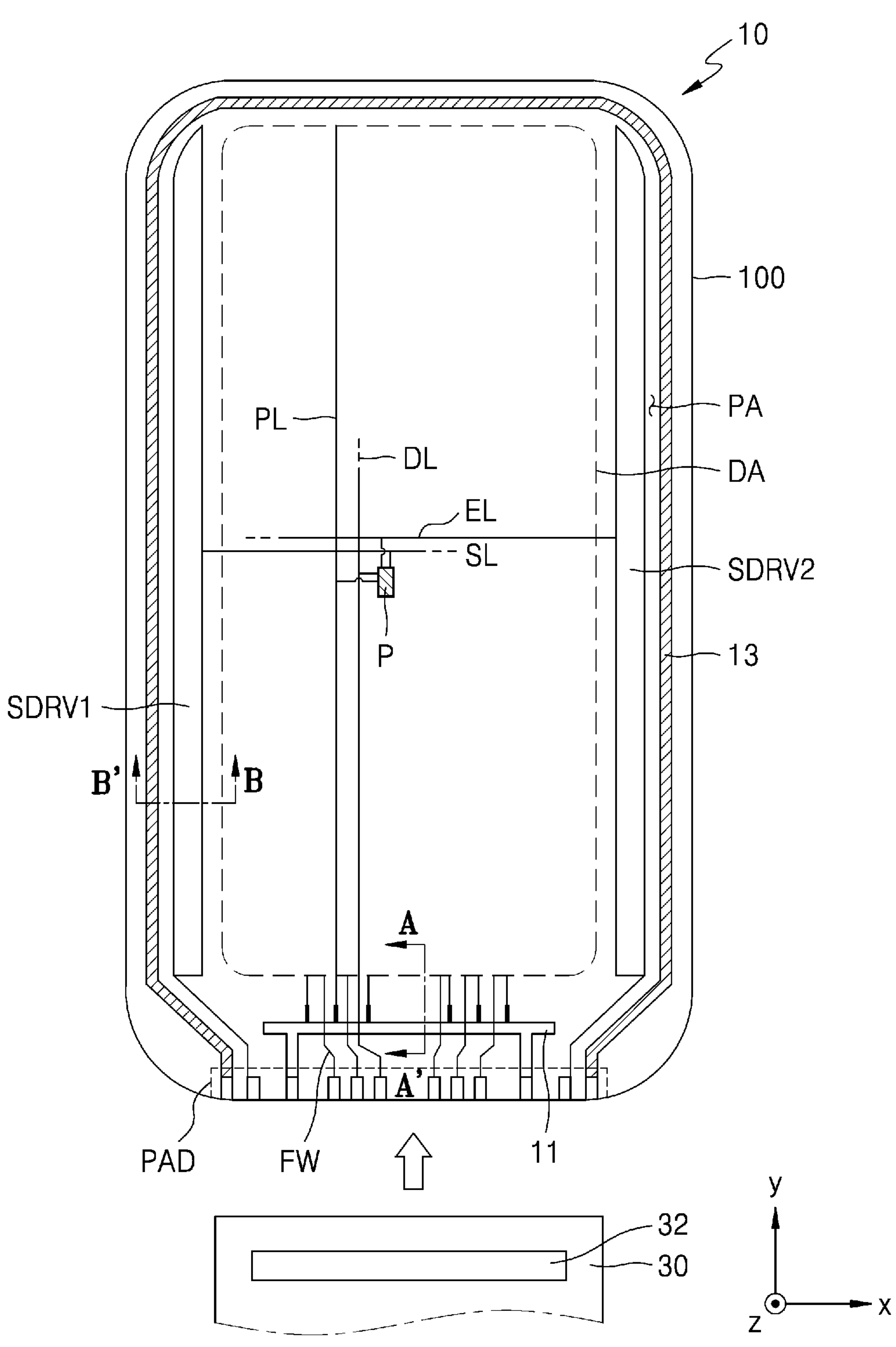
FIG. 3 is a plan view of a display panel according to an embodiment.

FIG. 3 is a plan view of a display panel 10 according to an embodiment.

Referring to FIG. 3, all elements constituting the display panel 10 are disposed over a substrate 100. The substrate 100 includes the display area DA and the peripheral area PA surrounding the display area DA.

A plurality of pixels P and signal lines that may be configured to apply electric signals to the plurality of pixels P may be arranged in the display area DA. Each of the pixels P may be implemented by a display element, such as an organic light-emitting element OLED. Each pixel P may emit, for example, red, green, blue, or white light. The display area DA may be protected from external air, moisture, or the like by being covered by an encapsulation member.

The signal lines that may apply electric signals to the plurality of pixels P may include a plurality of scan lines SL and a plurality of data lines DL. Each of the plurality of scan lines SL may extend in the first direction (x-direction), and each of the data lines DL may extend in the second direction (y-direction). The plurality of scan lines SL may be arranged, for example, in a plurality of rows and configured to transfer scan signals to the pixels P, and the plurality of data lines DL may be arranged, for example, in a plurality of columns and configured to transfer data signals to the pixels P. Each of the plurality of pixels P may be connected to at least one corresponding scan line SL of the plurality of scan lines SL, and connected to at least one corresponding data line DL of the plurality of data lines DL.

The signal lines may further include a plurality of driving voltage lines PL, a plurality of emission control lines EL, and the like. Each of the plurality of emission control lines EL may extend in the x direction, and each of the plurality of driving voltage lines PL may extend in the y direction. The plurality of emission control lines EL may be arranged, for example, in a plurality of rows and configured to transfer emission control signals to the pixels P. The plurality of driving voltage lines PL may be arranged, for example, in a plurality of columns and configured to transfer driving voltage signals (driving voltages) to the pixels P.

Each of pixel circuits driving the pixels P may be electrically connected to outer circuits arranged in the peripheral area PA. The peripheral area PA is a region in which the pixels P are not arranged. Various kinds of electronic elements, a printed circuit board, or the like may be electrically attached in the peripheral area PA, and a voltage line and the like configured to supply power for driving the pixels P may be arranged in the peripheral area PA. As an example, a first scan driving circuit SDRV1, and a second scan driving circuit SDRV2, a terminal part PAD, and a power supply line may be arranged in the peripheral area PA. The power supply line may include a driving voltage supply line 11 and a common voltage supply line 13.

The first scan driving circuit SDRV1 may be configured to apply scan signals to each of pixel circuits through the scan lines SL, the pixel circuits being configured to drive the pixels P. The second scan driving circuit SDRV2 may be configured to apply emission control signals to the pixel circuits through emission control lines EL. The second scan driving circuit SDRV2 may be arranged opposite the first scan driving circuit SDRV1 with the display area DA therebetween, and be approximately parallel to the first scan driving circuit SDRV1.

The terminal part PAD may be arranged on one side of the substrate 100. That is, the terminal part PAD is disposed in the peripheral area PA. The terminal part PAD may be exposed and connected to a display circuit board 30 by not being covered by an insulating layer. A display driver 32 may be arranged on the display circuit board 30.

The display driver 32 may be configured to generate control signals transferred to the first scan driving circuit SDRV1 and the second scan driving circuit SDRV2. The display driver 32 may be configured to generate data signals, and the generated data signals may be transferred to the pixel circuits through fan-out wirings FW and the data lines DL connected to the fan-out wirings FW. The fan-out wirings FW may extend in the y-direction.

The display driver 32 may be configured to supply a driving voltage ELVDD (see FIG. 4) to the driving voltage supply line 11 and supply a common voltage ELVSS (see FIG. 4) to the common voltage supply line 13. The driving voltage ELVDD may be applied to the pixel circuits of the pixel P through a driving voltage line PL connected to the driving voltage supply line 11. The common voltage ELVSS may be applied to an opposite electrode of display elements through the common voltage supply line 13.

The driving voltage supply line 11 disposed below the display area DA may be connected to the terminal part PAD and may extend in the x-direction. The common voltage supply line 13 may be connected to the terminal part PAD, may have a loop shape having one open side (e.g., below the lower side of the display area DA), and partially surround the display area DA. The common voltage supply line 13 may extend in the y-direction on the left side and the right side of the display area DA, and extend in the x-direction above the display area DA.

Figure 4:
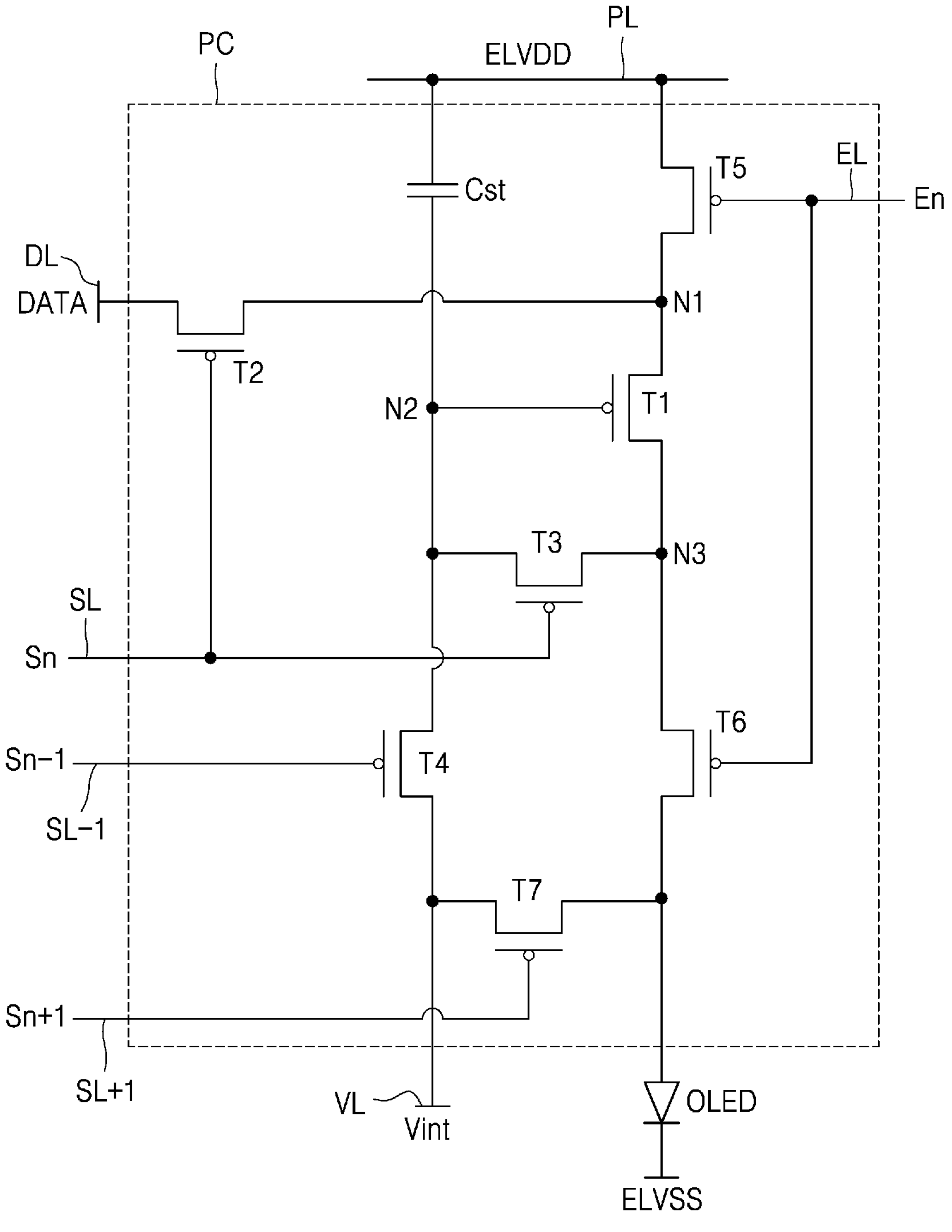
FIG. 4 is an equivalent circuit diagram of a pixel according to an embodiment.

FIG. 4 is an equivalent circuit diagram of a pixel according to an embodiment.

Referring to FIG. 4, a pixel circuit PC may include first to seventh transistors T1, T2, T3, T4, T5, T6, and T7 and a capacitor Cst. A first terminal of each of the first to seventh transistors T1, T2, T3, T4, T5, T6, and T7 may be a source terminal or a drain terminal, and a second terminal may be a terminal different from the first terminal depending on a type (a P-type or an N-type) of the transistors. As an example, in the case where the first terminal is a source terminal, the second terminal may be a drain terminal.

The pixel circuit PC may be connected to a first scan line SL, a second scan line SL−1, a third scan line SL+1, the emission control line EL, the data line DL, the driving voltage line PL, and an initialization voltage line VL, wherein the first scan line SL is configured to transfer first scan signals Sn, the second scan line SL−1 is configured to transfer second scan signals Sn−1, the third scan line SL+1 is configured to transfer third scan signals Sn+1, the emission control line EL is configured to transfer emission control signals En, the data line DL is configured to transfer data signals DATA, the driving voltage line PL is configured to transfer the driving voltage ELVDD, and the initialization voltage line VL is configured to transfer an initialization voltage Vint.

The first transistor T1 includes a gate terminal, a first terminal, and a second terminal, wherein the gate terminal is connected to a second node N2, the first terminal is connected to a first node N1, and the second terminal is connected to a third node N3. The first transistor T1 serves as a driving transistor, receives a data signal DATA, and supplies a driving current to a light-emitting element according to a switching operation of the second transistor T2. The light-emitting element may be an organic light-emitting element OLED.

The second transistor T2 (a switching transistor) includes a gate terminal, a first terminal, and a second terminal, wherein the gate terminal is connected to the first scan line SL, the first terminal is connected to the data line DL, and the second terminal is connected to the first node N1 (or the first terminal of the first transistor T1). The second transistor T2 may be turned on according to a first scan signal Sn transferred through the first scan line SL and may perform a switching operation of transferring a data signal DATA to the first node N1, wherein the data signal DATA is transferred through the data line DL.

The third transistor T3 (a compensation transistor) includes a gate terminal, a first terminal, and a second terminal, wherein the gate terminal is connected to the first scan line SL, the first terminal is connected to the second node N2 (or the gate terminal of the first transistor T1), and the second terminal is connected to the third node N3 (or the second terminal of the first transistor T1). The third transistor T3 may be turned on according to a first scan signal Sn to diode-connect the first transistor T1, wherein the first scan signal Sn is transferred through the first scan line SL. The third transistor T3 may have a structure in which two or more transistors are connected in series.

The fourth transistor T4 (a first initialization transistor) includes a gate terminal, a first terminal, and a second terminal, wherein the gate terminal is connected to the second scan line SL−1, the first terminal is connected to the initialization voltage line VL, and the second terminal is connected to the second node N2. The fourth transistor T4 may be turned on according to a second scan signal Sn−1 to initialize the gate voltage of the first transistor T1 by transferring the initialization voltage Vint to the gate terminal of the first transistor T1, wherein the second scan signal Sn−1 is transferred through the second scan line SL−1. The fourth transistor T4 may have a structure in which two or more transistors are connected in series.

The fifth transistor T5 (a first emission control transistor) includes a gate terminal, a first terminal, and a second terminal, wherein the gate terminal is connected to the emission control line EL, the first terminal is connected to the driving voltage line PL, and the second terminal is connected to the first node N1. The sixth transistor T6 (a second emission control transistor) includes a gate terminal, a first terminal, and a second terminal, wherein the gate terminal is connected to the emission control line EL, the first terminal is connected to the third node N3, and the second terminal is connected to a pixel electrode of the organic light-emitting element OLED. The fifth transistor T5 and the sixth transistor T6 are simultaneously turned on according to an emission control signal En, and a current flows through the organic light-emitting element OLED, wherein the emission control signal En is transferred through the emission control line EL.

The seventh transistor T7 (a second initialization transistor) includes a gate terminal, a first terminal, and a second terminal, wherein the gate terminal is connected to the third scan line SL+1, the first terminal is connected to the pixel electrode of the organic light-emitting element OLED, and the second terminal is connected to the initialization voltage line VL. The seventh transistor T7 may be turned on according to a third scan signal Sn+1 to initialize the voltage of the pixel electrode of the organic light-emitting element OLED by transferring the initialization voltage Vint to the pixel electrode of the organic light-emitting element OLED, wherein the third scan signal Sn+1 is transferred through the third scan line SL+1. The seventh transistor T7 may be omitted.

The capacitor Cst may include a first electrode and a second electrode, wherein the first electrode is connected to the second node N2, and the second electrode is connected to the driving voltage line PL.

The organic light-emitting element OLED may include the pixel electrode and an opposite electrode facing the pixel electrode. The opposite electrode may be configured to receive the common voltage ELVSS. The organic light-emitting element OLED may display images by receiving the driving current from the first transistor T1 and emitting light of a preset color. The opposite electrode may be provided in common, that is, as one body, over the plurality of pixels.

Though it is shown in FIG. 4 that the fourth transistor T4 and the seventh transistor T7 are connected to the second scan line SL−1 and the third scan line SL+1 respectively, the embodiment is not limited thereto. In another embodiment, both the fourth transistor T4 and the seventh transistor T7 are connected to the second scan line SL−1 and driven according to a second scan signal Sn−1.

Figure 5:
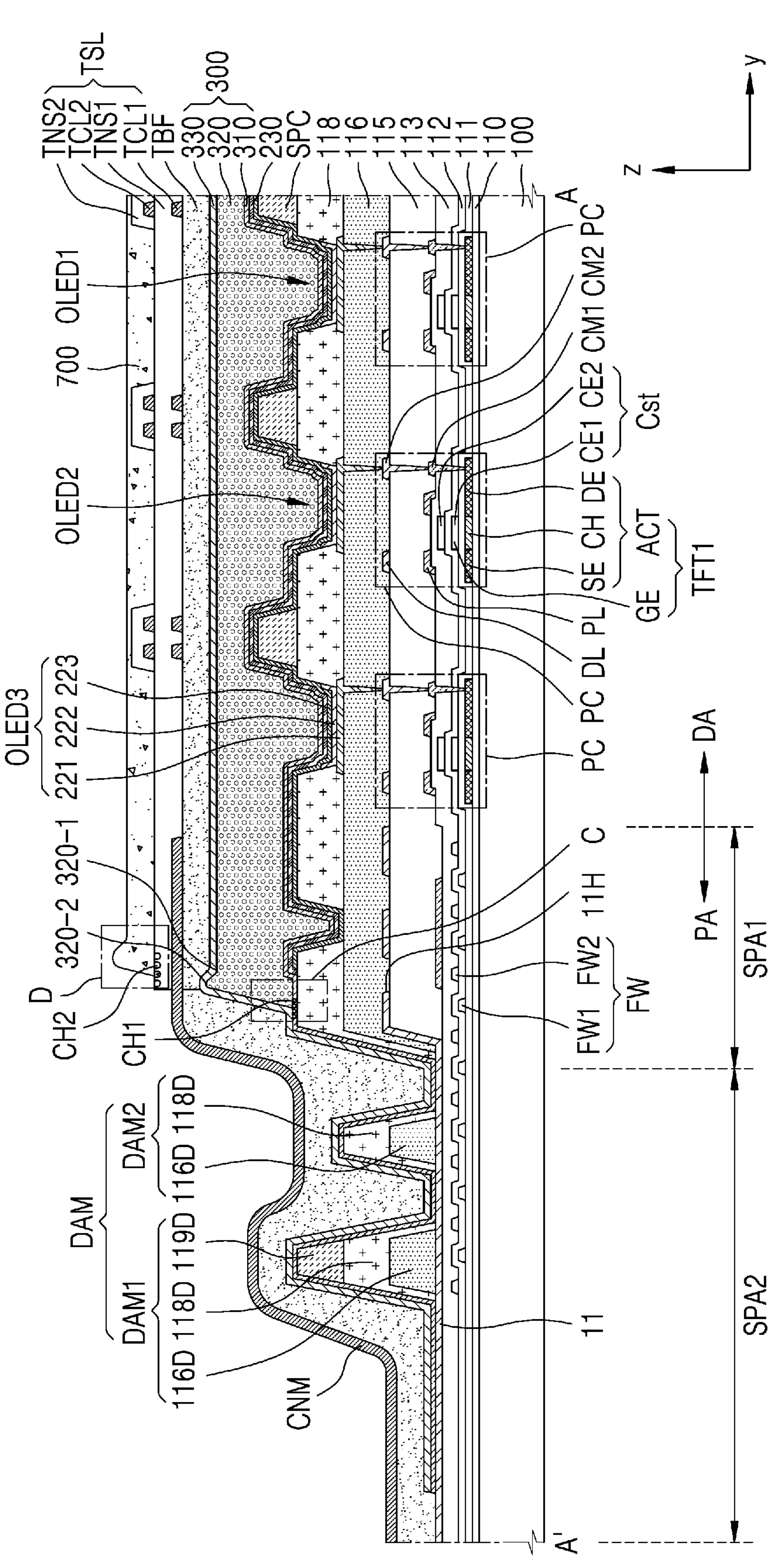
FIG. 5 is a cross-sectional view of a portion of a display apparatus taken along line A-A' illustrated in FIG. 3 according to an embodiment.

FIG. 5 is a cross-sectional view of a portion of the display apparatus taken along line A-A' illustrated in FIG. 3 according to an embodiment.

Referring to FIG. 5, in the case where the display panel 10 is manufactured, various layers may be sequentially formed over the substrate 100.

Specifically, the pixel circuit PC and the organic light-emitting element OLED (e.g., see FIG. 4) electrically connected to the pixel circuit PC may be arranged in the display area DA of the substrate 100. The pixel circuit PC may include a first thin-film transistor TFT1 and a capacitor Cst.

The substrate 100 may include various materials, such as metal, plastic, or the like. In an embodiment, the substrate 100 may be a flexible substrate. The substrate 100 may include a first base layer, a first barrier layer, a second base layer, and a second barrier layer that are sequentially stacked. The first base layer and the second base layer may each include a polymer resin. As an example, the first base layer and the second base layer may each include a polymer resin, such as polyethersulfone (PES), polyarylate (PAR), polyetherimide (PEI), polyethylene naphthalate (PEN), polyethylene terephthalate (PET), polyphenylene sulfide (PPS), polyimide (PI), polycarbonate (PC), cellulose tri acetate (TAC), cellulose acetate propionate (CAP), and the like. The polymer resin may be transparent. The first barrier layer and the second barrier layer may each be layers preventing the penetration of external foreign materials, and may include a single layer or a multi-layer including an inorganic material, such as amorphous silicon, silicon nitride, and/or silicon oxide.

A buffer layer 110 may be disposed on the substrate 100. The buffer layer 110 may block foreign materials or moisture penetrating through the substrate 100. The buffer layer 110 may include an inorganic material, such as silicon oxide, silicon nitride, and/or silicon oxynitride, and include a single layer or a multi-layer.

The first thin-film transistor TFT1 may be one of the transistors described with reference to FIG. 4, for example, the first transistor T1, which is a driving transistor. The first thin-film transistor TFT1 may include a semiconductor layer ACT, a gate electrode GE, a source electrode, and a drain electrode.

The semiconductor layer ACT may include amorphous silicon, polycrystalline silicon, an oxide semiconductor material or an organic semiconductor material. The semiconductor layer ACT may include a channel region CH, a source region SE, and a drain region DE, wherein the channel region CH overlaps the gate electrode GE, and the source region SE and the drain region DE are respectively arranged on two opposite sides of the channel region CH and include impurities. Here, the impurities may include N-type impurities or P-type impurities. The source region SE and the drain region DE may respectively be the source electrode and the drain electrode of the first thin-film transistor TFT1.

The gate electrode GE may include at least one of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu), and include a single layer or a multi-layer by taking into account adhesion with adjacent layers, surface flatness of stacked layers, workability, and the like. A first gate insulating layer 111 may be disposed between the semiconductor layer ACT and the gate electrode GE.

The capacitor Cst includes a lower electrode CE1 and an upper electrode CE2 overlapping each other with a second gate insulating layer 112 therebetween. The capacitor Cst may overlap the first thin-film transistor TFT1. FIG. 5 shows that the gate electrode GE of the first thin-film transistor TFT1 serves as the lower electrode CE1 of the capacitor Cst. In another embodiment, the capacitor Cst may not overlap the first thin-film transistor TFT1.

Each of the first gate insulating layer 111 and the second gate insulating layer 112 may include an inorganic insulating material including silicon oxide, silicon nitride, silicon oxynitride, aluminum oxide, titanium oxide, tantalum oxide, hafnium oxide, and the like. Each of the first gate insulating layer 111 and the second gate insulating layer 112 may include a single layer or a multi-layer including the above materials.

The capacitor Cst may be covered by an interlayer insulating layer 113. The interlayer insulating layer 113 may include an inorganic insulating material including silicon oxide, silicon nitride, silicon oxynitride, aluminum oxide, titanium oxide, tantalum oxide, hafnium oxide, and the like. The interlayer insulating layer 113 may include a single layer or a multi-layer including the above materials.

The driving voltage line PL and a first connection electrode CM1 may be disposed on the interlayer insulating layer 113. The driving voltage line PL and the first connection electrode CM1 may each include at least one of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu), and include a single layer or a multi-layer. In an embodiment, the driving voltage line PL and the first connection electrode CM1 may each include a multi-layer of Ti/Al/Ti.

A first insulating layer 115 may be disposed on the driving voltage line PL and the first connection electrode CM1. The data line DL and a second connection electrode CM2 may be disposed on the first insulating layer 115. The data line DL and the second connection electrode CM2 may include the same material as that of the driving voltage line PL. As an example, the data line DL and the second connection electrode CM2 may each include at least one of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu), and include a single layer or a multi-layer. In an embodiment, the data line DL and the second connection electrode CM2 may each include a multi-layer of Ti/Al/Ti. The data line DL and the second connection electrode CM2 may each be covered by a second insulating layer 116. As shown in FIG. 5, a portion of the data line DL may overlap the driving voltage line PL. In another embodiment, the data line DL may not overlap the driving voltage line PL.

Though it is shown in the embodiment of FIG. 5 that the data line DL is disposed over the driving voltage line PL, the data line DL may be disposed on the interlayer insulating layer 113, or the driving voltage line PL may be disposed on the first insulating layer 115, and thus, the data line DL may be disposed on the same layer as that of the driving voltage line PL in another embodiment. In another embodiment, the driving voltage line PL may have a two-layered structure including a lower driving voltage line and an upper driving voltage line, wherein the lower driving voltage line is disposed on the interlayer insulating layer 113, and the upper driving voltage line is disposed on the first insulating layer 115 and electrically connected to the lower driving voltage line.

The first insulating layer 115 and the second insulating layer 116 are planarization insulating layers and may be organic insulating layers. As an example, the first insulating layer 115 and the second insulating layer 116 may each include an organic insulating material including a general-purpose polymer, such as polymethylmethacrylate (PMMA) or polystyrene (PS), polymer derivatives having a phenol-based group, an acryl-based polymer, an imide-based polymer, a siloxane-based polymer, an aryl ether-based polymer, an amide-based polymer, a fluorine-based polymer, a p-xylene-based polymer, a vinyl alcohol-based polymer, or a blend thereof. In an embodiment, the first insulating layer 115 and/or the second insulating layer 116 may each include an organic insulating layer including polyimide, or an organic insulating layer including siloxane.

A display element, for example, first to third organic light-emitting elements OLED1, OLED2, and OLED3, may be arranged in the display area DA on the second insulating layer 116. In this case, the first to third organic light-emitting elements OLED1, OLED2, and OLED3 may be arranged to be apart from each other, and organic light-emitting elements may include the first to third organic light-emitting elements OLED1, OLED2, and OLED3 emitting light of different colors. The first to third organic light-emitting elements OLED1, OLED2, and OLED3 emit light of different colors or light of the same color. Each of the first to third organic light-emitting elements OLED1, OLED2, and OLED3 may include a pixel electrode 221, an intermediate layer 222, and an opposite electrode 223. Hereinafter, for convenience of description, the case where the first to third organic light-emitting elements OLED1, OLED2, and OLED3 emit light of different colors is mainly described in detail.

The pixel electrode 221 of an organic light-emitting element OLED may be disposed on the second insulating layer 116 and connected to the first thin-film transistor TFT1 through the first connection electrode CM1 disposed on the interlayer insulating layer 113 and the second connection electrode CM2 disposed on the first insulating layer 115.

The pixel electrode 221 may include a conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the pixel electrode 221 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. In another embodiment, the pixel electrode 221 may further include a layer on/under the reflective layer, the layer including ITO, IZO, ZnO, or $In_2O_3$.

A third insulating layer 118 may be disposed on the second insulating layer 116. An opening corresponding to each pixel in the display area DA is defined in the third insulating layer 118. That is, an opening exposes a portion of the pixel electrode 221. The third insulating layer 118 is a pixel-defining layer, and the opening of the third insulating layer 118 may define an emission area of the pixel. The emission area may be a region in which the emission layer is arranged and from which light is emitted. That is, the third insulating layer 118 may be arranged to correspond to the rest of the regions except the emission areas, that is, correspond to a non-emission area. The size of the emission area may be different depending on the color of light emitted by the pixel.

The third insulating layer 118 may prevent arcs and the like from occurring at the edges of the pixel electrode 221 by increasing a distance between the edges of the pixel electrode 221 and the opposite electrode 223 over the pixel electrode 221. The third insulating layer 118 may include an organic material, such as polyimide (PI) or hexamethyldisiloxane (HMDSO).

The intermediate layer 222 may include an emission layer. The emission layer may include a polymer organic material or a low-molecular weight organic material emitting light having a preset color. In an embodiment, the intermediate layer 222 may include a first functional layer and/or a second functional layer, wherein the first functional layer is disposed under the emission layer, and the second functional layer is disposed on the emission layer. The first functional layer and/or the second functional layer may include one body over the plurality of pixel electrodes 221, or include a layer patterned to correspond to each of the plurality of pixel electrodes 221. In this case, the emission layer may be disposed in each of the first organic light-emitting element OLED1, the second organic light-emitting element OLED2, and the third organic light-emitting element OLED3. In this case, the emission layers disposed in the first organic light-emitting element OLED1, the second organic light-emitting element OLED2, and the third organic light-emitting element OLED3 may include different materials. In another embodiment, one emission layer may be disposed to cover the first organic light-emitting element OLED1, the second organic light-emitting element OLED2, and the third organic light-emitting element OLED3. In this case, the emission layer disposed in the first organic light-emitting element OLED1, the second organic light-emitting element OLED2, and the third organic light-emitting element OLED3 may include the same material and be disposed in the display area DA entirely. In this case, the emission layer may have a structure in which a plurality of different emission layers are stacked.

The first functional layer may include a single layer or a multi-layer. As an example, in the case where the first functional layer includes a polymer material, the first functional layer may include a hole transport layer (HTL), which has a single-layered structure, and may include polyethylene dihydroxythiophene (PEDOT, poly-(3,4)-ethylene-dihydroxy thiophene) or polyaniline (PANI). In the case where the first functional layer includes a low-molecular weight material, the first functional layer may include a hole injection layer (HIL) and an HTL.

The second functional layer may be omitted. As an example, in the case where the first functional layer and the emission layer include a polymer material, it is preferred that the second functional layer is formed to achieve excellent characteristics of the organic light-emitting element. The second functional layer may include a single layer or a multi-layer. The second functional layer may include an electron transport layer (ETL) and/or an electron injection layer (EIL).

The opposite electrode 223 faces the pixel electrode 221 with the intermediate layer 222 disposed therebetween. The opposite electrode 223 may include a conductive material having a low work function. As an example, the opposite electrode 223 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), or an alloy thereof. Alternatively, the opposite electrode 223 may further include a layer on the (semi) transparent layer, the layer including ITO, IZO, ZnO, or $In_2O_3$.

The opposite electrode 223 may be formed as one body over the plurality of organic light-emitting elements OLED in the display area DA and be disposed on the intermediate layer 222 and the third insulating layer 118 while facing the plurality of pixel electrodes 221.

A plurality of spacers SPC may be further arranged in the non-emission area of the display area DA. That is, the spacers SPC does not overlap the organic light-emitting elements OLED in the z-direction. The spacers SPC may be disposed between two pixel electrodes 221. The spacers SPC may be disposed on the third insulating layer 118. The spacers SPC may be insulating patterns having an island shape. The spacer SPC may be a polygon, such as a square, a circle, a triangle, an ellipse, and the like. The spacer SPC may include an organic insulating material, such as polyimide. Alternatively, the spacer SPC may include an inorganic insulating material, such as silicon nitride or silicon oxide, or include an organic insulating material and an inorganic insulating material. The spacers SPC may include a material different from that of the third insulating layer 118. Alternatively, the spacer SPC may include the same material as that of one of the first insulating layer 115, the second insulating layer 116, and the third insulating layer 118. The opposite electrode 223 may be disposed on the spacer SPC.

A thin-film encapsulation layer 300 may be disposed on the opposite electrode 223 to protect the display panel 10 from an external foreign material, moisture, or the like. The thin-film encapsulation layer 300 may include at least one inorganic encapsulation layer and at least one organic encapsulation layer. It is shown in FIG. 5 that the thin-film encapsulation layer 300 includes first and second inorganic encapsulation layers 310 and 330 and an organic encapsulation layer 320 disposed therebetween. In another embodiment, the number of organic encapsulation layers, the number of inorganic encapsulation layers, and a stacking order may be changed.

When needed, a plurality of layers including a capping layer 230 may be disposed between the first inorganic encapsulation layer 310 and the opposite electrode 223. Though it is shown in FIG. 5 that the capping layer 230 is provided, the capping layer 230 may be omitted in another embodiment.

The first and second inorganic encapsulation layers 310 and 330 may include an inorganic insulating material including aluminum oxide, titanium oxide, tantalum oxide, hafnium oxide, zinc oxide, silicon oxide, silicon nitride, silicon oxynitride, and the like. The organic encapsulation layer 320 may include polyethylene terephthalate, polyethylene naphthalate, polycarbonate, polyimide, polyethylene sulfonate, polyoxymethylene, polyarylate, hexamethyldisiloxane, an acryl-based resin (e.g., polymethylmethacrylate, poly acrylic acid, and the like), or an arbitrary combination thereof. Because the first inorganic encapsulation layer 310 is formed along the structure thereunder, the upper surface thereof may not be flat. The organic encapsulation layer 320 may cover the first inorganic encapsulation layer 310 and have a sufficient thickness. The upper surface of the organic encapsulation layer 320 may be substantially flat. The second inorganic encapsulation layer 330 may not expose the organic encapsulation layer 320 by extending outside the organic encapsulation layer 320 and contacting the first inorganic encapsulation layer 310.

The peripheral area PA of FIG. 5 may correspond to a portion of the lower side of the display area DA which is shown in FIG. 3. The peripheral area PA may include a first sub-peripheral area SPA1 and a second sub-peripheral area SPA2, wherein the first sub-peripheral area SPA1 is relatively adjacent to the display area DA, and the second sub-peripheral area SPA2 is relatively adjacent to the edge of the substrate 100 so that the second sub-peripheral area SPA2 is disposed outside of the first sub-peripheral area SPA1. The first insulating layer 115, the second insulating layer 116, and the third insulating layer 118 may extend from the display area DA and be arranged in the first sub-peripheral area SPA1. The second sub-peripheral area SPA2 may be a kind of dam region in which at least one dam DAM is arranged.

As depicted in FIG. 5, the dam DAM may include a first dam DAM1 and a second dam DAM2. In this case, the first and second dams DAM1 and DAM2 may be disposed on the inorganic layer. As an example, the first and second dams DAM1 and DAM2 may be disposed on the inorganic insulating layer including at least one of the buffer layer 110, the first gate insulating layer 111, the second gate insulating layer 112, and the interlayer insulating layer 113.

The first dam DAM1 and the second dam DAM2 may be provided in the second sub-peripheral area SPA2. In addition, the second dam DAM2 may be provided between the first dam DAM1 and the first sub-peripheral area SPA1. That is, the second dam DAM2 is disposed relatively closer to the display area DA than the first dam DAM1.

Each of the plurality of dams DAM may have a multi-layered structure including a plurality of layers. For the dam DAM to limit the position of the material for forming the organic encapsulation layer 320, it is preferable that the height of the first dam DAM1 which is arranged in the outermost side is relatively higher than the height of the second dam DAM2. The first dam DAM1 may include a greater number of layers than the second dam DAM2 such that the height of the first dam DAM1 arranged on the outermost side of the display area DA is greater than the height of the second dam DAM2. As an example, the second dam DAM2 may include two layers, that are, a first layer 116D and a second layer 118D, wherein the first layer 116D is a lowermost layer stacked in a direction away from the upper surface of the substrate 100, and the second layer 118D is disposed on the first layer 116D. The first dam DAM1 may include the first layer 116D, the second layer 118D, and a third layer 119D, wherein the first layer 116D is the lowermost layer stacked in the z-direction, the second layer 118D is disposed on the first layer 116D, and the third layer 119D is disposed on the second layer 118D.

The plurality of dams DAM may each include a plurality of organic insulating layers. As an example, the first layer 116D may be simultaneously formed while the second insulating layer 116 is formed in the display area DA, and the first layer 116D may include the same material as that of the second insulating layer 116. The second layer 118D may be simultaneously formed while the third insulating layer 118 is formed in the display area DA, and the second layer 118D may include the same material as that of the third insulating layer 118. The third layer 119D may be simultaneously formed while the spacer SPC is formed in the display area DA, and the third layer 119D may include the same material as that of the spacer SPC.

Referring to FIG. 5, as shown in FIG. 3, the driving voltage supply line 11 may be arranged in the peripheral area PA below the display area DA. The driving voltage supply line 11 may be arranged in the first sub-peripheral area SPA1 and the second sub-peripheral area SPA2. The driving voltage supply line 11 may be disposed between the first insulating layer 115 and the second insulating layer 116, in the first sub-peripheral area SPA1, and disposed on the interlayer insulating layer 113 in the second sub-peripheral area SPA2.

A plurality of holes 11H may be defined in the driving voltage supply line 11 arranged in the first sub-peripheral area SPA1. That is, the holes 11H may not be defined in the driving voltage supply line 11 arranged in the second sub-peripheral area SPA2. The holes 11H may serve as an outgassing path that discharges a gas occurring from the first insulating layer 115 to the outside. Through this, an issue that a gas or moisture occurring from the first insulating layer 115 penetrates to the display area DA and deteriorates the quality of an image displayed by the display apparatus 1 may be prevented or reduced. The driving voltage supply line 11 may include the same material as that of one of wirings disposed between the first insulating layer 115 and the second insulating layer 116 in the display area DA. As an example, the driving voltage supply line 11 may include the same material as that of the data line DL disposed on the first insulating layer 115 in the display area DA.

At least one wiring may be further provided in the first sub-peripheral area SPA1, wherein the at least one wiring is disposed between the interlayer insulating layer 113 and the first insulating layer 115 and overlaps the driving voltage supply line 11. The at least one wiring may include the same material as that of one of wirings disposed between the interlayer insulating layer 113 and the first insulating layer 115 in the display area DA. As an example, the at least one wiring may include the same material as that of the driving voltage line PL disposed on the interlayer insulating layer 113 in the display area DA.

A plurality of fan-out wirings FW may be arranged in the peripheral area PA. In an embodiment, as shown in FIG. 5, the fan-out wirings FW may be disposed on different layers with at least one insulating layer therebetween. As an example, a first fan-out wiring FW1 disposed on the first gate insulating layer 111 and a second fan-out wiring FW2 disposed on the second gate insulating layer 112 may be arranged alternately. That is, the first fan-out wiring FW1 and the second fan-out wiring FW2 do not overlap each other in the z-direction. Accordingly, an interval between the fan-out wirings FW adjacent to each other may be reduced. In another embodiment, the fan-out wirings FW may be disposed on the same layer. As an example, the fan-out wirings FW may be disposed on the first gate insulting layer 111 or the second gate insulating layer 112. In another embodiment, the fan-out wirings FW may be arranged in the first sub-peripheral area SPA1 and the second sub-peripheral area SPA2.

The first scan driving circuit SDRV1 and the second scan driving circuit SDRV2 may be arranged in the first sub-peripheral area SPAT.

Each of the first inorganic encapsulation layer 310 and the second inorganic encapsulation layer 330 may cover the first and second dams DAM1 and DAM2 and be formed to the outside of the first and second dams DAM1 and DAM2. Because the position of the organic encapsulation layer 320 is limited by the first and second dams DAM1 and DAM2, a material for forming the organic encapsulation layer 320 may be prevented from overflowing to the outside of the first and second dams DAM1 and DAM2. An input sensing layer (not shown) may be disposed on the thin-film encapsulation layer 300. The input sensing layer may include a touch sensing layer TSL. In this case, the touch sensing layer TSL may have a structure in which a first touch conductive layer TCL1, a first touch insulating layer TNS1, a second touch conductive layer TCL2, and a second touch insulating layer TNS2 are sequentially stacked in the z-direction. The touch sensing layer TSL may further include a touch buffer layer TBF or the input sensing layer may further include the touch buffer layer TBF.

In an embodiment, the second touch conductive layer TCL2 acts as a touch electrode sensing whether a contact is made, and the first touch conductive layer TCL1 may serve as a connector connecting the second touch conductive layer TCL2 that is patterned in one direction.

In an embodiment, both the first touch conductive layer TCL1 and the second touch conductive layer TCL2 may act as touch electrodes. As an example, the first touch insulating layer TNS1 may include a via hole exposing the upper surface of the first touch conductive layer TCL1. The first touch conductive layer TCL1 may be connected to the second touch conductive layer TCL2 through the via hole. When the first touch conductive layer TCL1 and the second touch conductive layer TCL2 are used, the resistance of the touch electrode is reduced and the response speed of the touch sensing layer TSL may be improved.

In an embodiment, the touch electrode may be formed in a mesh structure such that light emitted from the first to third organic light-emitting elements OLED1, OLED2, and OLED3 passes through the mesh structure. Accordingly, the first touch conductive layer TCL1 and the second touch conductive layer TCL2 may be disposed not to overlap the first to third organic light-emitting elements OLED1, OLED2, and OLED3.

Each of the first touch conductive layer TCL1 and the second touch conductive layer TCL2 may include a single layer or a multi-layer including a conductive material having high conductivity. As an example, the first touch conductive layer TCL1 and the second touch conductive layer TCL2 may include a single layer or a multi-layer including a transparent conductive layer and/or a conductive material including aluminum (Al), copper (Cu), molybdenum (Mo) and/or titanium (Ti). The transparent conductive layer may include a transparent conductive oxide, such as indium tin oxide (ITO), indium zinc oxide (IZO), zinc oxide (ZnO), and indium tin zinc oxide (ITZO). In addition, the transparent conductive layer may include a conductive polymer such as poly-(3,4)-ethylene-dihydroxythiophene (PEDOT), metal nanowires, graphene, and the like. In another embodiment, the first touch conductive layer TCL1 may include molybdenum (Mo), and the second touch conductive layer TCL2 may have a stack structure of Ti/Al/Ti.

The first touch conductive layer TCL1 or the second touch conductive layer TCL2 may be connected to a touch wiring CNM passing across the peripheral area PA. In this case, the touch wiring CNM may be connected to the terminal part PAD shown in FIG. 3.

The first touch insulating layer TNS1 and the second touch insulating layer TNS2 may each include an inorganic material or an organic material. The inorganic material may include at least one of silicon nitride, aluminum nitride, zirconium nitride, titanium nitride, hafnium nitride, tantalum nitride, silicon oxide, aluminum oxide, titanium oxide, tin oxide, cerium oxide, or silicon oxynitride. The organic material may include at least one of an acryl-based resin, a methacryl-based resin, a polyisoprene, a vinyl-based resin, an epoxy-based resin, a urethane-based resin, a cellulose-based resin, and a perylene-based resin.

In an embodiment, the first touch insulating layer TNS1 and the second touch insulating layer TNS2 may be arranged in the display area DA entirely and arranged in some portions of the peripheral area PA. In this case, color filters, an optical functional layer such as a polarizing film and the like may be disposed on the second touch insulating layer TNS2.

In another embodiment, color filters may be disposed on the second touch insulating layer TNS2, or a quantum-dot layer, a light-transmissive layer, and the color filters may be disposed on the second touch insulating layer TNS2. Hereinafter, for convenience of description, the case where a quantum-dot layer, a light-transmissive layer, and color filters are arranged on the second touch insulating layer TNS2 is mainly described in detail.

The second touch insulating layer TNS2 may be formed in a pattern shape. As an example, the second touch insulating layer TNS2 may be formed to completely shield the second touch conductive layer TCL2. A high refractive layer 700 may be disposed on the second touch insulating layer TNS2. The high refractive layer 700 may be arranged to cover the display area DA entirely and some portions of the peripheral area PA.

The refractive index of the second touch insulating layer TNS2 may be different from the refractive index of the high refractive layer 700. As an example, the refractive index of the second touch insulating layer TNS2 may be less than the refractive index of the high refractive layer 700. Specifically, the refractive index of the second touch insulating layer TNS2 may be about 1.3 to about 1.6, and the refractive index of the high refractive layer 700 may be about 1.7 to about 1.9.

The high refractive layer 700 may include at least one of an acryl-based organic material and a siloxane-based organic material. In an embodiment, the high refractive layer 700 may include polydiarylsiloxane, methyltrimethoxysilane, or tetramethoxysilane. In an embodiment, the high refractive layer 700 may be formed by coating a material by an inkjet printing process and then hardening the material. In another embodiment, the high refractive layer 700 may be formed by an evaporation process.

In an embodiment, metal oxide particles such as zinc oxide (ZnO), titanium oxide ($TiO_2$), zirconium oxide ($ZrO_2$), and barium titanate ($BaTiO_3$) may be dispersed the high refractive layer 700. In an embodiment, the high refractive layer 700 may be formed by coating an organic material including metal oxide particles using an inkjet printing process. The touch buffer layer TBF may be further disposed between the thin-film encapsulation layer 300 and the touch sensing layer TSL. The touch buffer layer TBF may be directly formed on the thin-film encapsulation layer 300. The touch buffer layer TBF may prevent damage to the thin-film encapsulation layer 300 and block interference signals that may occur while the touch sensing layer TSL is driven. The touch buffer layer TBF may include an inorganic material such as an inorganic insulating material such as silicon oxide ($SiO_2$), silicon nitride ($SiN_x$), silicon oxynitride (SiON), and include a single layer or a multi-layer.

Though not shown in the drawing, a quantum-dot layer or a light-transmissive layer may be disposed on a position of the touch sensing layer TSL corresponding to each pixel. As an example, a second color quantum-dot layer is disposed on the second light-emitting element (e.g., the second organic light-emitting element OLED2) located in a second pixel PX2 (e.g., see FIG. 9). That is, the second color quantum-dot layer is disposed on a second pixel electrode of the second light-emitting element located in the second pixel PX2. Accordingly, when viewed in the z-direction perpendicular to the substrate 100, the second color quantum-dot layer overlaps the second pixel electrode. The second color quantum-dot layer may convert light in a first wavelength band generated from the intermediate layer 222 on the second pixel electrode into light in a second wavelength band.

Figure 9:
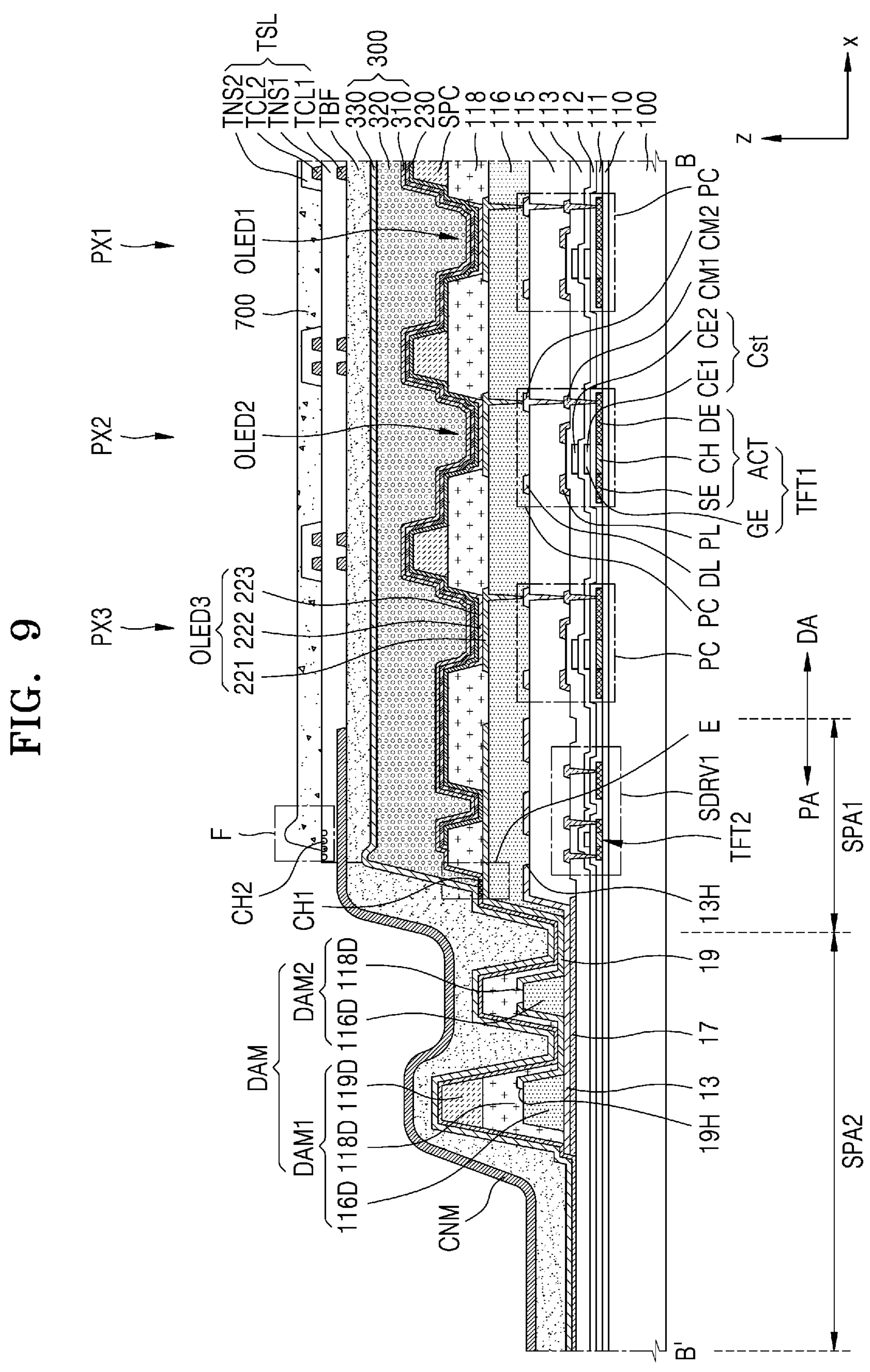
FIG. 9 is a schematic cross-sectional view of a display apparatus taken along line B-B' illustrated in FIG. 3 according to an embodiment.

A third color quantum-dot layer is disposed on the third light-emitting element (e.g., the third organic light-emitting element OLED3) located in a third pixel PX3 (e.g., see FIG. 9). That is, the third color quantum-dot layer is disposed on a third pixel electrode of the third light-emitting element located in the third pixel PX3. Accordingly, when viewed in the z-direction perpendicular to the substrate 100, the third color quantum-dot layer overlaps the third pixel electrode. The third color quantum-dot layer may convert light in a second wavelength band generated from the intermediate layer 222 on the third pixel electrode into light in a third wavelength band. In this case, the first wavelength band may be the same as or different from the second wavelength band.

Each of the second color quantum-dot layer and the third color quantum-dot layer may have a shape in which quantum dots are dispersed in a resin. In the present embodiment, embodiments described below, and modified examples thereof, quantum dots denote crystals of a semiconductor compound, and may include an arbitrary material that may emit light in various wavelength bands depending on the size of the crystal. A diameter of the quantum dots may be, for example, about 1 μm to about 10 μm.

Quantum dots may be synthesized by a wet chemical process, a metal organic chemical vapor deposition process, a molecular beam epitaxy process, or a similar process. A wet chemical process is a method of mixing an organic solvent with a precursor material and then growing quantum dot crystals. In a wet chemical process, when the crystal grows, the organic solvent naturally acts as a dispersant coordinated on the surface of the quantum dot crystal and controls the growth of the crystal. Accordingly, the wet chemical process is easier than vapor deposition such as metal organic chemical vapor deposition (MOCVD) or molecular beam epitaxy (MBE). In addition, the wet chemical process may be configured to control the growth of the quantum dots at low costs.

The quantum dot may include one of a Group III-VI semiconductor compound, a Group II-VI semiconductor compound, a Group III-V semiconductor compound, a Group I-III-VI semiconductor compound, a Group IV-VI semiconductor compound, a Group IV element or compound, and an arbitrary combination thereof.

Examples of a Group III-VI semiconductor compound may include a two-element compound including $In_2S_3$, a three-element compound including AgInS, $AgInS_2$, CuInS, and an arbitrary combination thereof.

Examples of a Group II-VI semiconductor compound may include a two-element compound including CdS, CdSe, CdTe, ZnS, ZnSe, ZnTe, ZnO, HgS, HgSe, HgTe, MgSe or MgS, a three-element compound including CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe or MgZnS, a four-element compound including CdZnSeS, CdZnSeTe, CdZnSTe, CdHgSeS, CdHgSeTe, CdHgSTe, HgZnSeS, HgZnSeTe, HgZnSTe and the like, and an arbitrary combination thereof.

Examples of a group III-V semiconductor compound may include a two-element compound including one of GaN, GaP, GaAs, GaSb, AlN, AlP, AlAs, AlSb, InN, InP, InAs, and InSb; a three-element compound including one of GaNP, GaNAs, GaNSb, GaPAs, GaPSb, AlNP, AlNAs, AlNSb, AlPAs, AlPSb, InGaP, InNP, InAlP, InNAs, InNSb, InPAs, and InPSb; and a four-element compound including one of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and InAlPSb, and an arbitrary combination thereof. The Group III-V semiconductor compound may further include a Group II element. Examples of a Group III-V semiconductor compound further including a Group II element may include InZnP, InGaZnP, and InAlZnP.

Examples of a Group III-VI semiconductor compound may include a two-element compound including GaS, GaSe, $Ga_2Se_3$, GaTe, InS, InSe, $In_2Se_3$ and InTe, and a three-element compound including $InGaS_3$ and $InGaSe_3$, and an arbitrary combination thereof.

Examples of a Group I-III-VI semiconductor compound may include a three-element compound including AgInS, $AgInS_2$, CuInS, $CuInS_2$, $CuGaO_2$, $AgGaO_2$, $AgAlO_2$, and an arbitrary combination thereof.

Examples of a Group IV-VI semiconductor compound may include a two-element compound including SnS, SnSe, SnTe, PbS, PbSe, PbTe, a three-element compound including SnSeS, SnSeTe, SnSTe, PbSeS, PbSeTe, PbSTe, SnPbS, SnPbSe, SnPbTe, a four-element compound including SnPbSSe, SnPbSeTe, SnPbSTe, and an arbitrary combination thereof.

Examples of a Group IV element or compound may include a single-element matter including Si or Ge, a two-element compound including SiC or SiGe, and an arbitrary combination thereof.

Each element included in a multi-element compound such as a two-element compound, a three-element compound, and a four-element compound may be present in a particle in a uniform concentration or a non-uniform concentration.

A quantum dot may have a single structure in which the concentration of each element included in the relevant quantum dot is uniform, or a double structure of a core-shell. As an example, a material of the core may be different from a material of the shell. The shell of a quantum dot may serve as a protective layer that prevents a chemical change of the core to maintain a semiconductor characteristic and/or serve as a charging layer for giving an electrophoretic characteristic to the quantum dot. The shell may include a single layer or a multi-layer. An interface between the core and the shell may have a concentration gradient in which the concentration of an element existing in the shell reduces toward the center.

Examples of the shell of the quantum dot include oxide of metal or non-metal, a semiconductor compound, or a combination thereof. Examples of oxides of metals or non-metals may include a two-element compound including $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, and a three-element compound including $MgAl_2O_4$, $CoFe_2O_4$, $NiFe_2O_4$, $CoMn_2O_4$, and an arbitrary combination thereof. Examples of the semiconductor compound may include, as described above, a Group III-VI semiconductor compound, a Group II-VI semiconductor compound, a Group III-V semiconductor compound, a Group III-VI semiconductor compound, a Group I-III-VI semiconductor compound, and a Group IV-VI semiconductor compound, and an arbitrary combination thereof. As an example, the semiconductor compound may include one of CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and an arbitrary combination thereof.

A quantum dot may have a full width of half maximum (FWHM) of a light emission wavelength spectrum of 45 nm or less, specifically about 40 nm or less, and more specifically about 30 nm or less. Within this range, color purity or color reproduction may be improved. In addition, because light emitted from the quantum dot is emitted in all directions, a viewing angle of light may be improved.

In addition, the shape of the quantum dot may be a spherical shape, a pyramid shape, a multi-arm shape, a cubic shape, a nanoparticle, a nanotube, a nanowire, a nanofiber, a nano plate particle, or the like.

Because an energy band gap may be adjusted by adjusting the size of the quantum dot, light in various wavelength bands may be obtained from a quantum-dot emission layer. Accordingly, a light-emitting element that emits light in various wavelengths may be implemented by using quantum dots of different sizes. Specifically, the size of the quantum dot may be selected such that red, green, and/or blue light is emitted. In addition, the size of the quantum dot may be configured such that light in various colors is combined to emit white light.

The second color quantum-dot layer and the third color quantum-dot layer may each also include scatters. In addition, for a resin used for the second color quantum-dot layer and the third color quantum-dot layer, any material may be used as long as the material has a high dispersion characteristic for the scatterers and a light-transmissive characteristic. As an example, a polymer resin such as an acryl-based resin, an imide-based resin, or an epoxy-based resin may be used for the resin of the second color quantum-dot layer and the third color quantum-dot layer.

The scatters of the second color quantum-dot layer and the third color quantum-dot layer may be particles, for example, light-scattering particles having a refractive index different from that of the light-transmissive resin of the second color quantum-dot layer and the third color quantum-dot layer. The scatterers are not particularly limited as long as they are materials that may partially scatter transmitted light by forming an optical interface between the scatterers and the light-transmissive resin. For example, the scatterers may be metal oxide particles or organic particles. Examples of metal oxides for scatterers include titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$). Examples of an organic material for the scatters include an acrylic resin or a urethane resin. The scatterers may scatter light in various directions regardless of an incident angle while substantially not converting the wavelength of incident light. Through this, the scatterers may improve the lateral visibility of the display apparatus. In addition, the scatterers of the second color quantum-dot layer and the third color quantum-dot layer may increase a light-converting efficiency by increasing a probability that light incident to the second color quantum-dot layer and the third color quantum-dot layer meets the quantum dots.

The first pixel PX1 (e.g., see FIG. 9) emits light in a first wavelength generated from the intermediate layer 222 to the outside without wavelength conversion. Accordingly, the first pixel PX1 does not include the quantum-dot layer. Accordingly, a light-transmissive layer is disposed on a first light-emitting element (e.g., the first organic light-emitting element OLED1) located in the first pixel PX1. That is, the light-transmissive layer is disposed on a first pixel electrode of the first light-emitting element located in the first pixel PX1. Accordingly, when viewed in the z-direction perpendicular to the substrate 100, the light-transmissive layer overlaps the first pixel electrode.

The light-transmissive layer may include scatterers. For a resin of the light-transmissive layer, any material may be used as long as the material has a high dispersion characteristic for the scatterers and a light-transmissive characteristic. As an example, a polymer resin such as an acryl-based resin, an imide-based resin, and an epoxy-based resin may be used for the resin of the light-transmissive layer.

The scatterers of the light-transmissive layer may be particles, for example, light-scattering particles having a refractive index different from that of the light-transmissive resin of the light-transmissive layer. The scatterers are not particularly limited as long as they are materials that may partially scatter transmitted light by forming an optical interface between the scatterers and the light-transmissive resin. For example, the scatterers may be metal oxide particles or organic particles. Examples of metal oxides for scatterers include titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$). Examples of an organic material for the scatters include an acrylic resin or a urethane resin. The scatterers may scatter light in various directions regardless of an incident angle while substantially not converting the wavelength of incident light (lambertian reflection). Through this, the scatterers may improve the lateral visibility of the display apparatus.

As described above, the light-transmissive layer, the second color quantum-dot layer, and the third color quantum-dot layer are arranged to correspond to the first pixel electrode, the second pixel electrode, and the third pixel electrode. For this purpose, the bank layer including opening areas may be disposed on the thin-film encapsulation layer 300, wherein the opening areas respectively correspond to the first pixel electrode, the second pixel electrode, and the third pixel electrode. When the opening areas of the bank layer correspond to the first, second, and third pixel electrodes, it means that when viewed in the z-direction perpendicular to the substrate 100, the opening areas overlap the first pixel electrode, the second pixel electrode, and the third pixel electrode. The bank layer may include various materials, for example, an inorganic material, such as silicon oxide, silicon nitride, and silicon oxynitride. In another embodiment, the bank layer may include a photoresist material. Through this, the bank layer may be formed by processes such as exposure and developing processes.

The color filters may be disposed on the bank layer, the second color quantum-dot layer, the third color quantum-dot layer, and the light-transmissive layer. In this case, the color filters may be disposed to correspond to the respective pixels. As an example, a first color filter layer is disposed to correspond to the first organic light-emitting element OLED1, a second color filter layer is disposed to correspond to the second organic light-emitting element OLED2, and a third color filter layer is disposed to correspond to the third organic light-emitting element OLED3.

The first color filter layer may transmit only light in a wavelength band from about 450 nm to about 495 nm, the second color filter layer may transmit only light in a wavelength band from about 495 nm to about 570 nm, and the third color filter layer may transmit only light in a wavelength band from about 630 nm to about 780 nm. The first, second, and third color filter layers may reduce external light reflection in the display apparatus.

As an example, when external light reaches the first-color color filter layer (e.g., the first color filter layer), only light in the wavelength band set in advance passes through the first-color color filter layer as described above, and light in other wavelength bands is absorbed by the first-color color filter layer. Accordingly, among external light incident to the display apparatus, only light in the wavelength band set in advance passes through the first-color color filter layer as described above, and a portion of the light is reflected by the opposite electrode 223 or the first pixel electrode and emitted to the outside again. As a result, because, among external light incident to where the first pixel PX1 is located, only a portion of the external light is reflected, external light reflection may be reduced. This description is applicable to the second-color color filter layer (e.g., the second color filter layer) and the third-color color filter layer (e.g., the third color filter layer).

Though it is shown in FIG. 5 that transistors of the pixel circuit PC are P-type transistors, the embodiment is not limited thereto. As an example, the transistors of the pixel circuit may be N-type transistors, or some may be P-type transistors, and others may be N-type transistors. However, various embodiments may be made.

The display panel 10 may include a control groove. The control groove may be configured to control the position of the end of at least one of the organic encapsulation layer 320 and the high refractive layer 700. Specifically, the control groove may include a first control groove CH1 disposed in the end of the organic encapsulation layer 320. The control groove may include a second control groove CH2 disposed in the end of the high refractive layer 700.

The first control groove CH1 may be disposed at various positions. As an example, the first control groove CH1 may be disposed between the dam DAM and the third organic light-emitting element OLED3. In another embodiment, in the case where the dam DAM is provided in plurality, the first control groove CH1 is disposed between the plurality of dams DAM. In another embodiment, the first control groove CH1 may be disposed outside of the dam DAM. In this case, the first control groove CH1, the dam DAM, and the third organic light-emitting element OLED3 may be sequentially arranged in the y-direction.

The second control groove CH2 may be disposed at various positions. As an example, the second control groove CH2 may be disposed on the first touch insulating layer TNS1. In another embodiment, the second control groove CH2 may be disposed on the touch wiring CNM.

The first control groove CH1 may limit flowing of the organic encapsulation layer 320. As an example, the organic encapsulation layer 320 may be formed by supplying an organic material on the first inorganic encapsulation layer 310 in an inkjet method. In this case, the organic encapsulation layer 320 may flow on one side of the first inorganic encapsulation layer 310. In this case, when the organic encapsulation layer 320 moves too widely, a highest point 320-2 and a lowest point 320-1 of the organic encapsulation layer 320 may occur, wherein the highest point 320-2 is a point at which a height of the organic encapsulation layer 320 measured from the lower surface of the substrate 100 to the upper surface of the organic encapsulation layer 320 is highest, and the lowest point 320-1 is a point at which the height is lowest. In this case, when a difference occurs between the height of the lowest point 320-1 of the organic encapsulation layer 320 and the height of the flat surface of the organic encapsulation layer 320, the lowest point 320-1 of the organic encapsulation layer 320 may be viewed. In this case, because the plurality of first control grooves CH1 hinder the flowing of the organic encapsulation layer 320, the above issue may not occur.

Specifically, in the case where the plurality of first control grooves CH1 are disposed, when the organic encapsulation layer 320 flows and meets the outline of the plurality of first control grooves CH1, the moving of the organic encapsulation layer 320 may be hindered. That is, because each first control groove CH1 makes a surface contact angle of the organic encapsulation layer 320 greater than the case where there is no first control groove CH1, the moving of the organic encapsulation layer 320 may be hindered. In this case, because the height of the highest point of the organic encapsulation layer 320 (measured from the lower surface of the substrate 100 to the upper surface of the organic encapsulation layer 320) may be formed higher than the case where there is no first control groove CH1, the height of the lowest point 320-1 of the organic encapsulation layer 320 may be maintained higher than before. Through this, the height of the lowest point 320-1 of the organic encapsulation layer 320 may be maintained to be nearly equal to the height of the flat portion (e.g., the flat surface) of the organic encapsulation layer 320.

In this case, when the first control groove CH1 is provided, a distance from a preset reference point to the end of the organic encapsulation layer 320 may be reduced by about 10% compared to the case where there is no first control groove CH1.

The same principle may be applicable to the second control groove CH2. That is, the second control groove CH2 may hinder the moving of the high refractive layer 700 at the end of the high refractive layer 700 when forming the high refractive layer 700. Through this, a highest point of the high refractive layer 700 may be maintained high as much as possible, wherein the highest point is highest among the heights from the lower surface of the substrate 100 to the upper surface of the high refractive layer 700 measured in the z-direction perpendicular to the lower surface of the substrate 100. In addition, a lowest point of the high refractive layer 700 may be maintained equal or nearly equal to the height of the flat upper surface of the high refractive layer 700, wherein the lowest point is lowest among the heights from the lower surface of the substrate 100 to the upper surface of the high refractive layer 700.

A maximum inner length of a planar shape of at least one of the first control groove CH1 and the second control groove CH2 may be about 100 μm or less. In this case, the length may denote a length of a straight line connecting two points arranged on the outline of the planar shape of at least one of the first control groove CH1 and the second control groove CH2 and passing through the center of the planar shape.

The first control groove CH1 and the second control groove CH2 may each be formed in an intaglio shape.

Hereinafter, the first control groove CH1 and the second control groove CH2 are described in detail.

FIGS. 6A, 6B, 6C, 6D, and 6E are schematic plan views of a first control groove CH1 shown in FIG. 5. Here, FIGS. 6A, 6B, 6C, 6D, and 6E are enlarged plan views of a region C and a region D of FIG. 5.

Figure 6A:
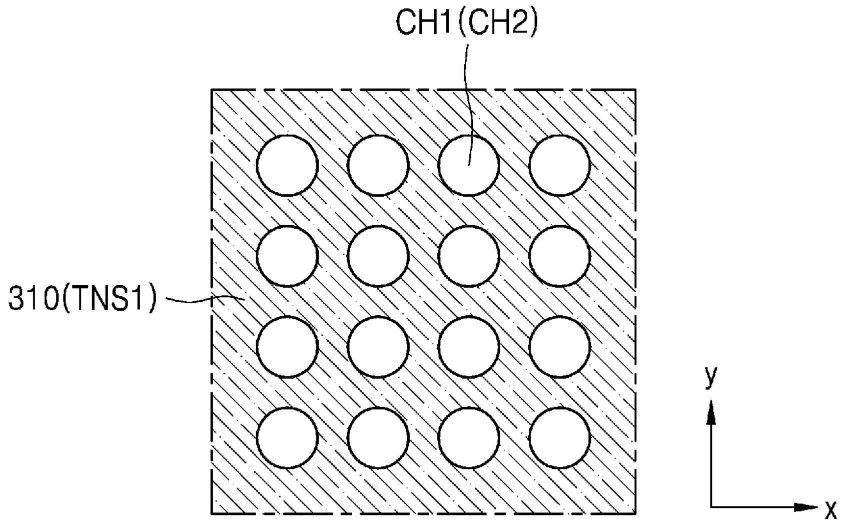
FIGS. 6A to 6E are schematic plan views of a first control groove shown in FIG. 5.
Figure 6B:
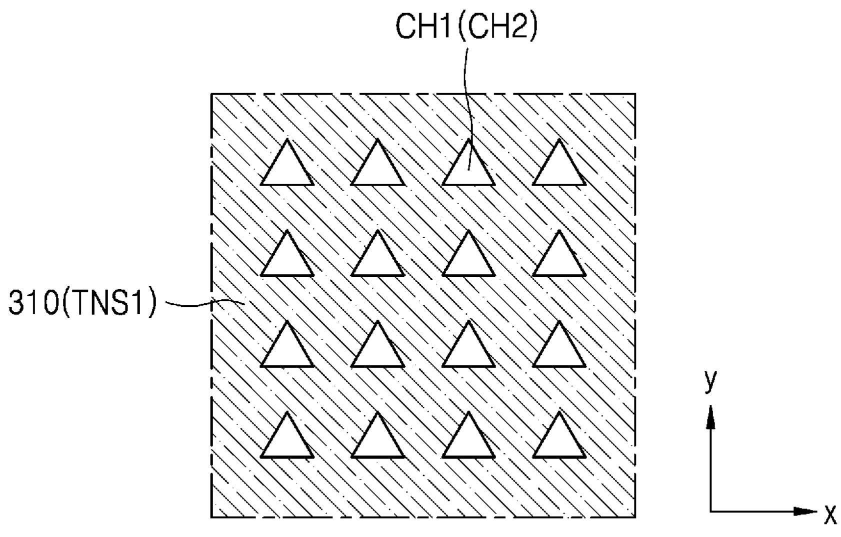
Figure 6C:
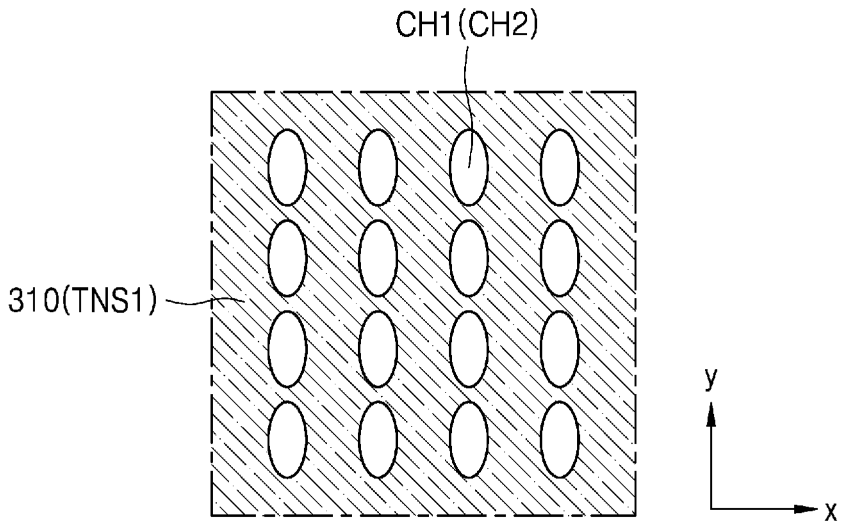
Figure 6D:
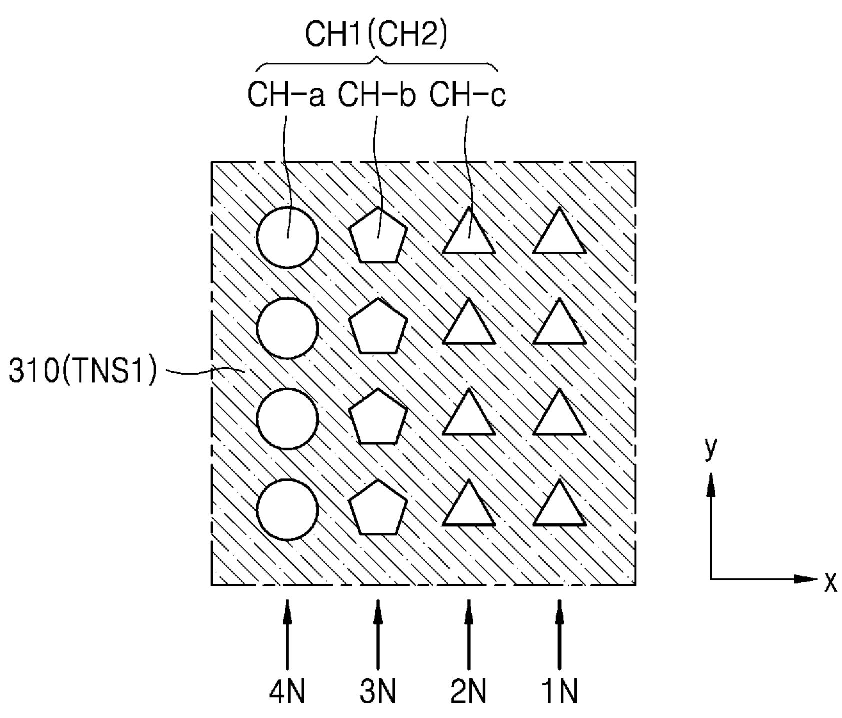

Referring to FIGS. 6A, 6B, 6C, 6D, and 6E, the first control groove CH1 may have various shapes. As an example, the planar shape of the first control groove CH1 may be a circle as shown in FIG. 6A. In another embodiment, the planar shape of the first control groove CH1 may be a triangular shape as shown in FIG. 6B. In another embodiment, the planar shape of the first control groove CH1 may be an elliptical shape as shown in FIG. 6C. In another embodiment, the planar shape of the first control groove CH1 may be a polygon of a quadrangle or more as shown in FIG. 6D. In another embodiment, though not shown in the drawing, the planar shape of the first control groove CH1 may include a portion of a circle, a portion of an ellipse, and/or a portion of a polygon. In another embodiment, the planar shape of the first control groove CH1 may be an irregular shape such as a star shape, a cross shape and the like.

The first control groove CH1 may be provided in plurality. The plurality of first control grooves CH1 may be spaced apart from each other in the x-direction and in the y-direction. In this case, the plurality of first control grooves CH1 may be arranged to surround the outline of the organic encapsulation layer 320. As an example, the plurality of first control grooves CH1 may be arranged in the outer portion of the outline of the display area DA, or in the outline of the display area DA of the display panel 10 shown in FIG. 3. In this case, the organic encapsulation layer 320 may be arranged to completely shield the display area DA of the display panel 10 shown in FIG. 3. In this case, at least some of the plurality of first control grooves CH1 may be covered by the organic encapsulation layer 320. As an example, the plurality of first control grooves CH1 may be disposed in each of a plurality of lines that form a closed loop while surrounding the periphery of the display area DA. In this case, some of the plurality of first control grooves CH1 may be spaced apart from each other along one of the plurality of lines to surround the outer portion of the outline of the display area DA. In addition, others of the plurality of first control grooves CH1 may be spaced apart from each other along another line of the plurality of lines. In this case, the other of the plurality of lines may be arranged outside one of the plurality of lines. Hereinafter, for convenience of description, the case where four lines are provided is mainly described in detail.

In this case, the planar shapes of the first control grooves CH1 arranged in different lines may be different from each other. As an example, among the plurality of lines, the first control groove CH1 arranged in a first line 1N arranged in the innermost side and the first control groove CH1 arranged in a second line 2N arranged outside the first line 1N may have a triangular shape as shown in FIG. 6D. Among the plurality of lines, the first control groove CH1 arranged in a third line 3N arranged outside the second line 2N may have a pentagonal shape. In addition, among the plurality of lines, the first control groove CH1 arranged in a fourth line 4N arranged in the outermost portion may have a circular shape. That is, the planar shape of the first control groove CH1 arranged in each of the plurality of lines may be close to a circular shape as the first control groove CH1 is away from the display area DA. Through this, the position of the end of the organic encapsulation layer 320 may be precisely controlled.

Figure 6E:
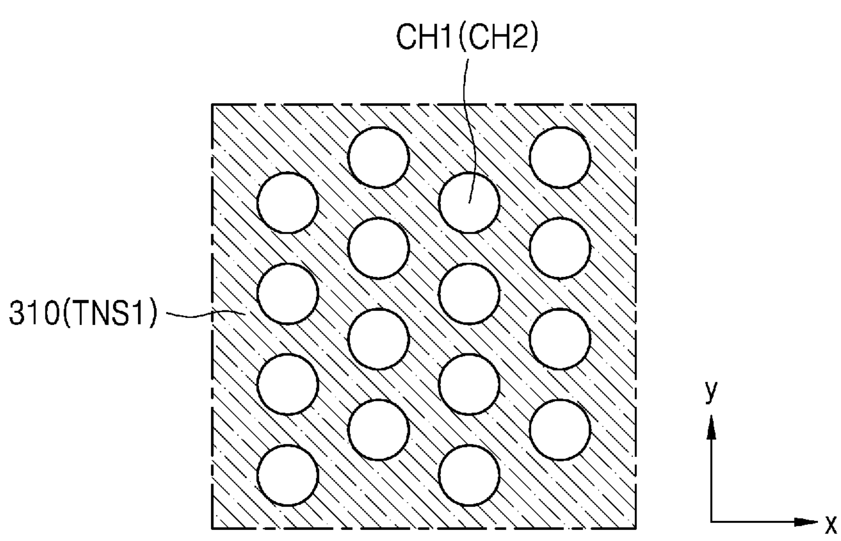

Referring to FIG. 6E, the first control groove CH1 arranged in line may be arranged in a zigzag shape. As an example, because the plurality of first control grooves CH1 arranged in the lateral surface of the display area DA are arranged in a zigzag shape (or a serpentine shape) in the x-direction of FIGS. 6A to 6D, the first control grooves CH1 arranged in different lines while adjacent to each other may not be arranged on a straight line parallel to the x-direction. Specifically, the first control groove CH1 arranged in the first line and the first control groove CH1 arranged in the second line may be disposed at different positions in the y-direction with respect to an origin of a coordinate axis. In addition, the first control groove CH1 arranged in the third line and the first control groove CH1 arranged in the second line may be disposed at different positions in the y-direction with respect to an origin of a coordinate axis. In this case, the first control grooves CH1 disposed in the first line and the third line may form a straight line parallel to the x-direction, and the first control grooves CH1 disposed in the second line and the fourth line may form a straight line parallel to the x-direction. In another embodiment, the first control grooves CH1 arranged in the first line, the second line, the third line, and the fourth line may be arranged in an oblique line. In this case, the first control grooves CH1 disposed in the lines may be arranged on different straight lines parallel to the x-direction.

FIGS. 7A, 7B, 7C, and 7D are schematic cross-sectional views of the first control groove CH1 shown in FIG. 5. FIGS. 7A, 7B, 7C, and 7D are enlarged cross-sectional views of a region C of FIG. 5.

Figure 7A:
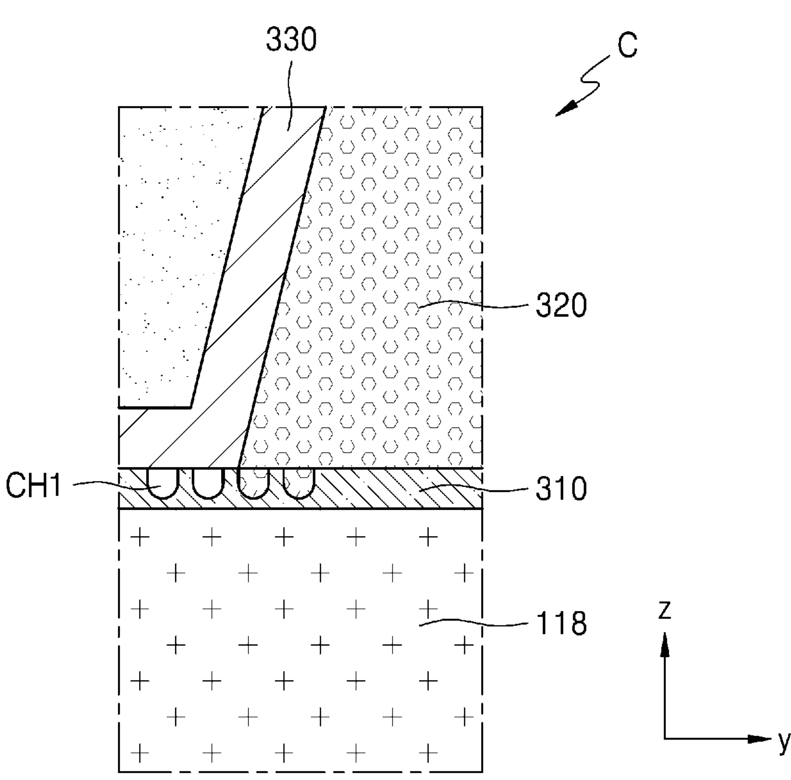
FIGS. 7A, 7B, 7C, and 7D are schematic cross-sectional views of the first control groove shown in FIG. 5.

Referring to FIGS. 7A, 7B, 7C, and 7D, the first control groove CH1 may be disposed in the first inorganic encapsulation layer 310, or the first inorganic encapsulation layer 310 and the third insulating layer 118. In this case, the first control groove CH1 may have various shapes and various depths in a depth direction. Specifically, as shown in FIG. 7A, the first control groove CH1 may be formed in at least a portion of the first inorganic encapsulation layer 310. In this case, the first control groove CH1 may have a shape indented from one side of the first inorganic encapsulation layer 310 in the thickness direction (e.g., the z-direction) of the first inorganic encapsulation layer 310. In this case, a portion of the organic encapsulation layer 320 may be inserted to some of the plurality of first control grooves CH1.

Figure 7B:
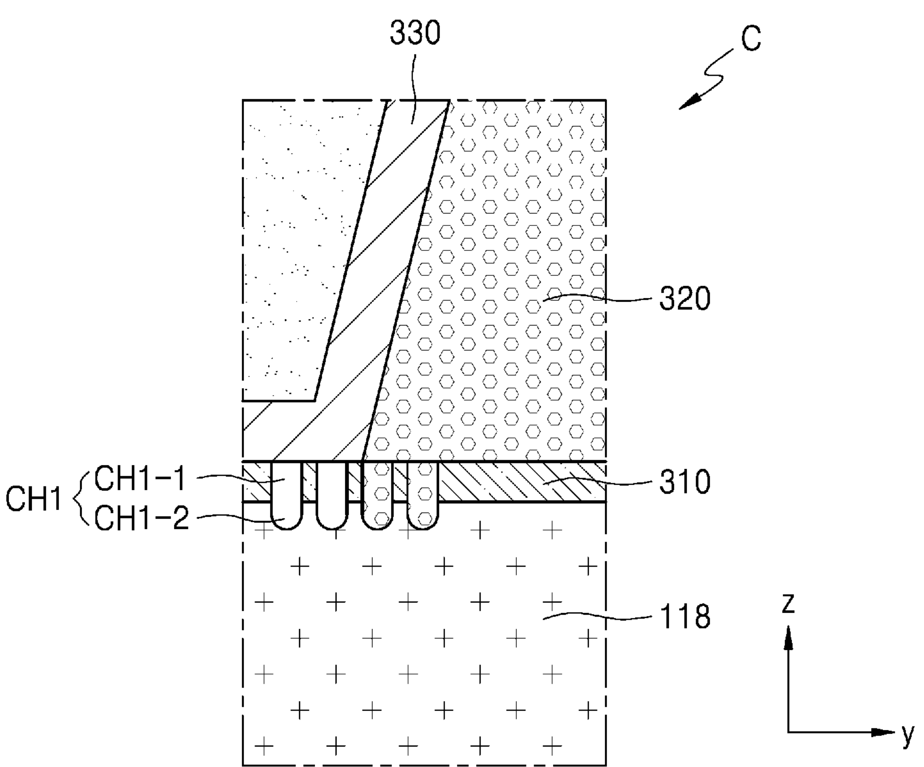

As shown in FIG. 7B, the first control groove CH1 may be formed in the first inorganic encapsulation layer 310 and the third insulating layer 118. In this case, the first control groove CH1 may be formed to completely pass through the first inorganic encapsulation layer 310. As an example, the first control groove CH1 may include a (1-1)st part CH1-1 and a (1-2)nd part CH1-2, wherein the (1-1)st part CH1-1 is arranged in the first inorganic encapsulation layer 310, and the (1-2)nd part CH1-2 is arranged in the third insulating layer 118.

Figure 7C:
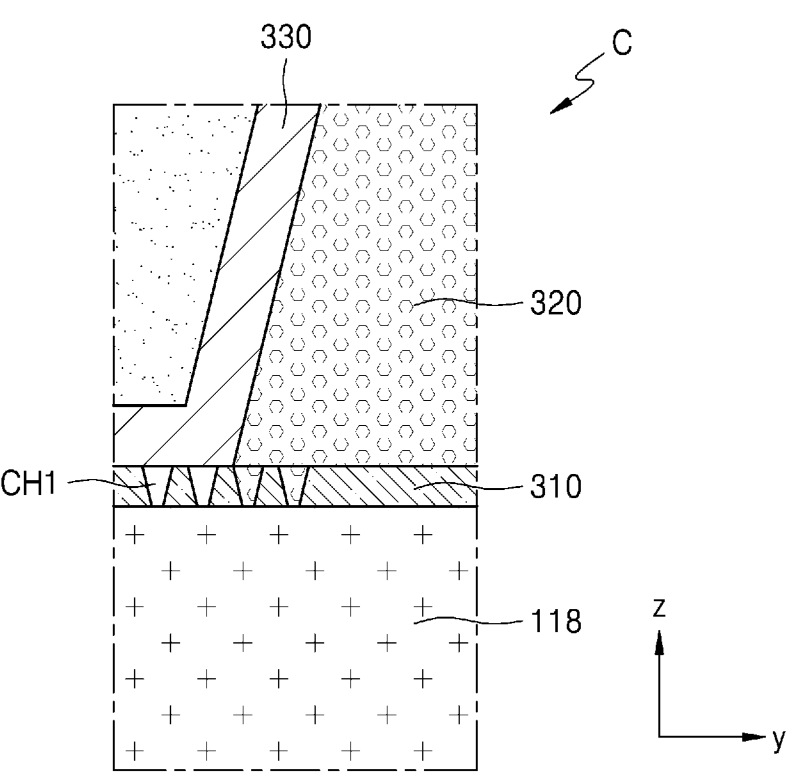
Figure 7D:
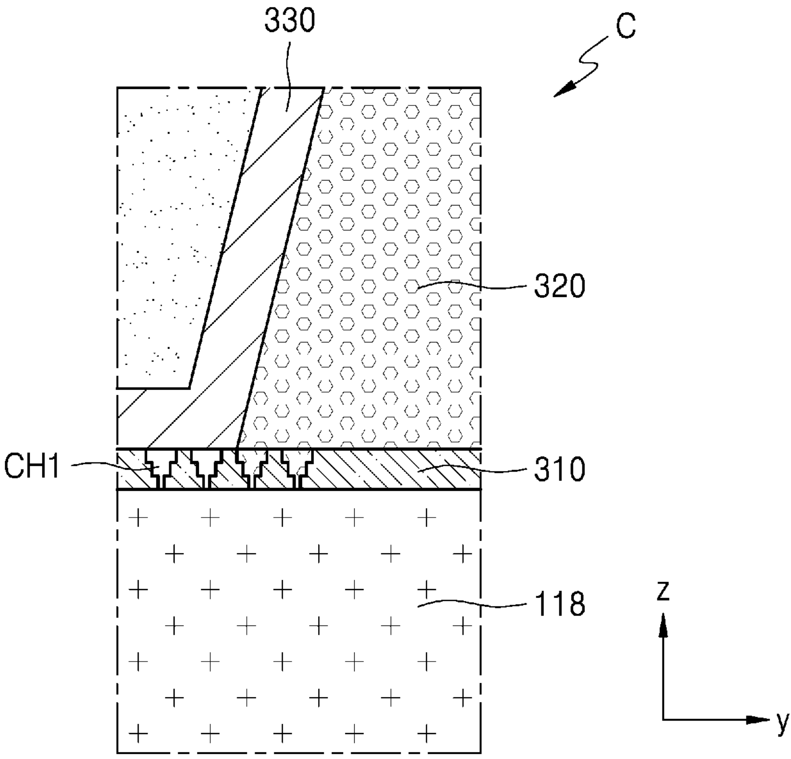

The cross-sectional shape of the first control groove CH1 may be formed in various shapes. As an example, the cross-sectional shape of the first control groove CH1 may be a U-shape as shown in FIGS. 7A and 7B. In another embodiment, the cross-sectional shape of the first control groove CH1 may be a trapezoidal shape as shown in FIG. 7C. In this case, the inner surface of the first control groove CH1 may be inclined. In another embodiment, the cross-sectional shape of the first control groove CH1 may be formed to have a step difference as shown in FIG. 7D. In this case, among lateral surfaces of the first control groove CH1, a lateral surface formed in the y-direction may be flat, and a surface formed in the z-direction may be inclined or a straight line shape. In addition, among the lateral surfaces of the first control groove CH1, a portion where a lateral surface formed in the y-direction is connected to a lateral surface formed in the z-direction may be pointed or rounded as shown in FIG. 7D.

In this case, when the lateral surface of the first control groove CH1 is formed to have a step difference, the same planar shape of the first control groove CH1 may be reduced. As an example, in the case where the planar shape of the first control groove CH1 is a circle, a first circle having a largest diameter may become the planar shape of the uppermost surface of the first control groove CH1, and a second circle may have a diameter less than that of the first circle, wherein the second circle is disposed below the first circle in the depth direction (e.g., an opposite direction of the z-direction) from the upper surface of the first control groove CH1. Because this relationship continues to proceed in the depth direction of the first control groove CH1, the lateral surface of the first control groove CH1 may be formed to have a step difference. In another embodiment, the planar shape of the upper surface of the first control groove CH1 may be different from the planar shape of the flat surface disposed in the depth direction of the first control groove CH1. Specifically, the planar shape of the upper surface of the first control groove CH1 may be a circle, and the planar shape of the flat surface the first control groove CH1 below the upper surface of the first control groove CH1 may be a polygon, an ellipse, or an irregular shape.

Figure 8A:
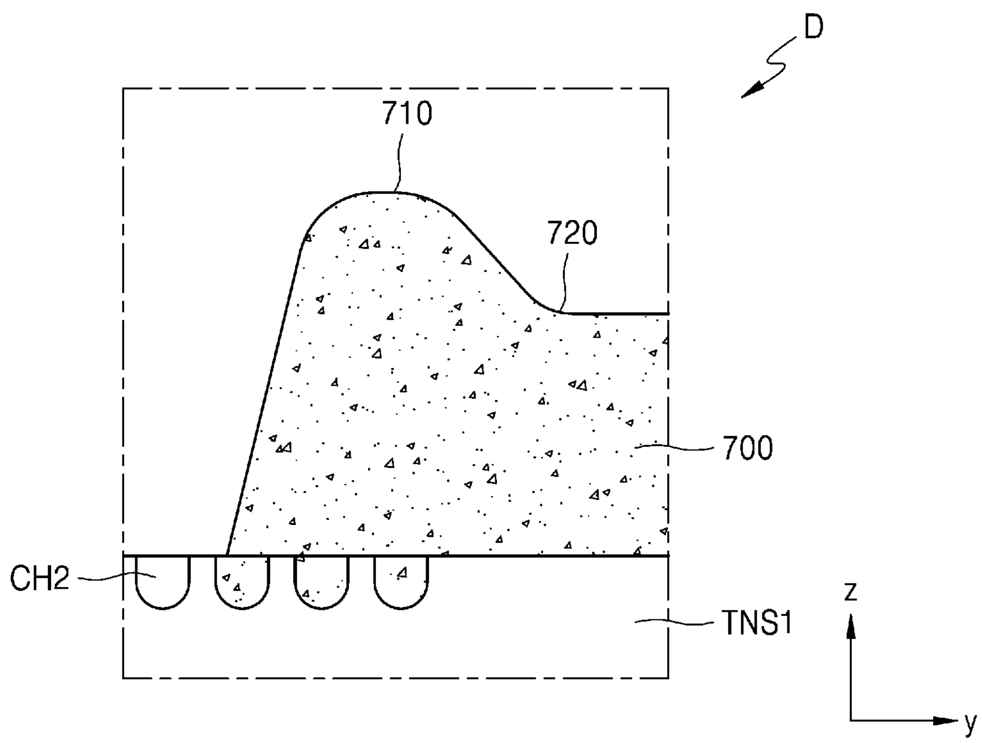
FIGS. 8A and 8B are schematic cross-sectional views of a second control groove shown in FIG. 5.
Figure 8B:
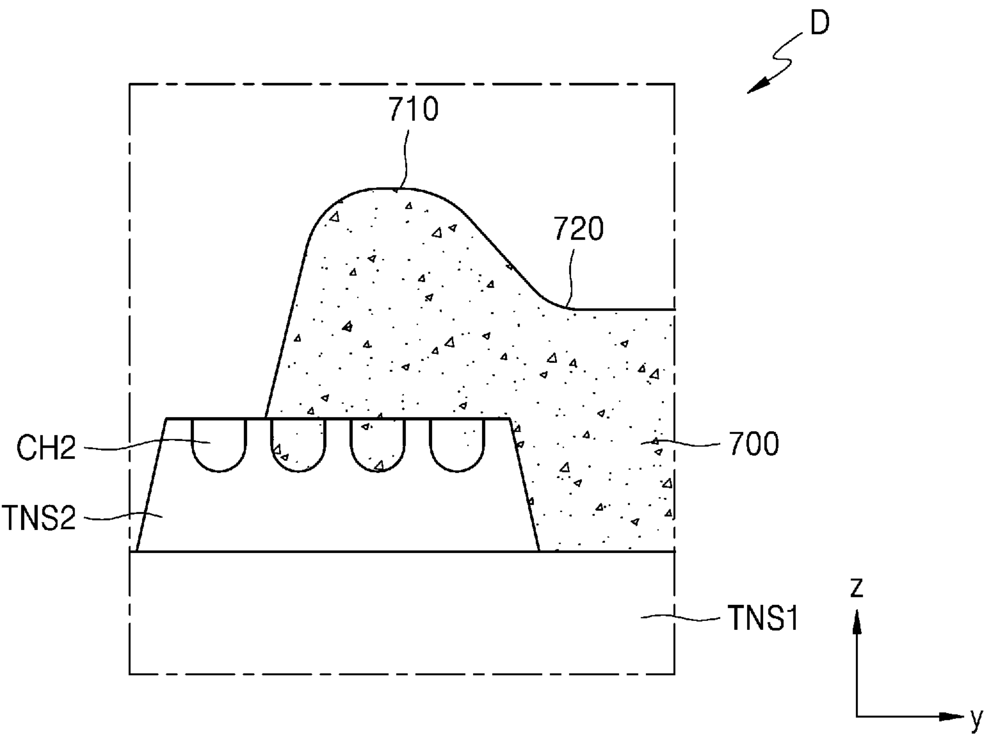

FIGS. 8A and 8B are schematic cross-sectional views of a second control groove CH2 shown in FIG. 5. FIGS. 8A and 8B are enlarged cross-sectional views of a region D of FIG. 5.

Referring to FIGS. 8A and 8B, the second control groove CH2 may be disposed in the first touch insulating layer TNS1 as shown in FIG. 8A. In another embodiment, the second control groove CH2 may be disposed in the second touch insulating layer TNS2 as shown in FIG. 8B.

The second control groove CH2 may be disposed identically or similarly to the first control groove CH1 shown in FIGS. 6A, 6B, 6C, and 6D (or FIGS. 6A to 6E) in a plan view. In addition, the second control groove CH2 may have a cross-sectional shape equal or similar to that of the first control groove CH1 described with reference to FIGS. 7A, 7B, and 7C (or FIGS. 7A to 7D).

In this case, the second control groove CH2 may be configured to control the position of the end of the high refractive layer 700. Specifically, the high refractive layer 700 may be arranged in the display area DA entirely. In this case, similar to the organic encapsulation layer 320, the high refractive layer 700 may be supplied by an inkjet method. In this case, the high refractive layer 700 may flow on the first touch insulating layer TNS1 and the second touch insulating layer TNS2, and a boundary may not be determined definitely.

In contrast, in the case where the second control groove CH2 is disposed, the position of the end of the high refractive layer 700 may be determined to some extent by the second control groove CH2. Particularly, in this case, flowing of the high refractive layer 700 may be controlled by a principle similar to the principle of controlling the end of the organic encapsulation layer 320 through the first control groove CH1.

In this case, a highest point 710 of the high refractive layer 700 may be disposed at a high position compared to the case where there is no second control groove CH2, wherein the highest point 710 is a point of the high refractive layer 700 at which a height thereof is highest. In addition, a lowest point 720 of the high refractive layer 700 may be disposed at a high position compared to the case where there is no second control groove CH2, wherein the lowest point 720 is a point of the high refractive layer 700 at which a height thereof is lowest.

In this case, after the display panel 10 is manufactured, a stripe pattern and the like may be prevented from being viewed to the outside due to the lowest point 720 of the high refractive layer 700.

FIG. 9 is a schematic cross-sectional view of a display apparatus taken along line B-B' illustrated in FIG. 3 according to an embodiment.

Referring to FIG. 9, the peripheral area PA may correspond to a portion of the left side or the right side of the display area DA shown in FIG. 3. The first scan driving circuit SDRV1 may include second thin-film transistors TFT2 and a wiring (not shown) connected to the second thin-film transistors TFT2. The second thin-film transistor TFT2 may be formed by the same process as a process of forming the first thin-film transistor TFT1 of the pixel circuit PC, and thus, detailed description of the second thin-film transistor TFT2 may be omitted. Though not shown, a control signal line may be further arranged in the first sub-peripheral area SPA1, wherein the control signal line is configured to apply control signals to the first scan driving circuit SDRV1. The control signal line may include signal lines configured to apply clock signals, inverted clock signals, carry signals, and the like. The control signal line may be disposed on the same layer as the semiconductor layer ACT, the gate electrode GE, the upper electrode CE2 of the capacitor Cst, or the driving voltage line PL.

As shown in FIG. 3, the common voltage supply line 13 may be arranged in the peripheral area PA on the left side, the right side, and the upper side of the display area DA. The common voltage supply line 13 may be arranged in the first sub-peripheral area SPA1 and the second sub-peripheral area SPA2. The common voltage supply line 13 may be disposed between the first insulating layer 115 and the second insulating layer 116 in the first sub-peripheral area SPA1 and may be disposed on the interlayer insulating layer 113 in the second sub-peripheral area SPA2.

A plurality of holes 13H may be defined in the common voltage supply line 13 arranged in the first sub-peripheral area SPA1. The holes 13H may serve as an outgassing path that discharges a gas occurring from the first insulating layer 115 to the outside. Through this, an issue that a gas or moisture occurring from the first insulating layer 115 penetrates to the display area DA and deteriorates the quality of an image displayed by the display apparatus 1 may be prevented or reduced. Though not shown, the holes 13H may be defined in the common voltage supply line 13 in a region adjacent to the display area DA, wherein the common voltage supply line 13 is arranged over the substrate 100. The common voltage supply line 13 may include the same material as that of one of wirings disposed between the first insulating layer 115 and the second insulating layer 116 in the display area DA. As an example, the common voltage supply line 13 may include the same material as that of the data line DL disposed on the first insulating layer 115 in the display area DA. The common voltage supply line 13 may be disposed on the same layer as the driving voltage supply line 11 and may include the same material as that of the driving voltage supply line 11 (e.g., see FIG. 3). The driving voltage supply line 11 may be apart from the common voltage supply line 13 on the same layer.

A voltage line 17 may be further disposed between the common voltage supply line 13 and the interlayer insulating layer 113 in the first and second sub-peripheral areas SPA1, SPA2. A portion of the common voltage supply line 13 arranged in the second sub-peripheral area SPA2 may overlap and directly contact the voltage line 17. The voltage line 17 may include the same material as that of one of wirings disposed between the interlayer insulating layer 113 and the first insulating layer 115 in the display area DA. As an example, the voltage line 17 may include the same material as that of the driving voltage line PL disposed on the interlayer insulating layer 113 in the display area DA. The common voltage supply line 13 may be configured to transfer the common voltage ELVSS (e.g., see FIG. 4) to the opposite electrode 223 through an auxiliary line 19, wherein the common voltage ELVSS is applied from the voltage line 17.

The auxiliary line 19 may be arranged in the first sub-peripheral area SPA1 and the second sub-peripheral area SPA2. The auxiliary line 19 may be disposed on the second insulating layer 116 in the first sub-peripheral area SPA1 and may be disposed on the common voltage supply line 13 in the second sub-peripheral area SPA2. A portion of the auxiliary line 19 arranged in the first sub-peripheral area SPA1 may be connected to the opposite electrode 223. As an example, the opposite electrode 223 may directly contact the auxiliary line 19 exposed by a hole defined in the third insulating layer 118 arranged in the first sub-peripheral area SPA1. A portion of the auxiliary line 19 in the second sub-peripheral area SPA2 may overlap and directly contact the common voltage supply line 13. A portion of the auxiliary line 19 in the second sub-peripheral area SPA2 may be disposed between a plurality of layers constituting a dam of the dam DAM. A hole 19H may be defined in the auxiliary line 19 disposed inside the dam DAM in the second sub-peripheral area SPA2, wherein the hole 19H exposes a portion of the upper surface of a layer disposed under the auxiliary line 19. The auxiliary line 19 may include the same material as that of one of wirings disposed between the second insulating layer 116 and the third insulating layer 118 in the display area DA. As an example, the auxiliary line 19 may include the same material as that of the pixel electrode 221 disposed on the second insulating layer 116 in the display area DA.

The driving voltage supply line 11 and the common voltage supply line 13 may be disposed on the inorganic layer. As an example, the driving voltage supply line 11 and the common voltage supply line 13 may be disposed on the inorganic insulating layer including at least one of the buffer layer 110, the first gate insulating layer 111, the second gate insulating layer 112, and the interlayer insulating layer 113.

It is required that a material for forming the organic encapsulation layer 320 is arranged in a region set in advance while the organic encapsulation layer 320 is formed. For this purpose, the dam DAM including at least one dam may be provided in the peripheral area PA. The dam DAM may have a line shape surrounding the display area DA. That is, the dam DAM forms a closed loop, and the display area DA may be arranged inside the dam DAM in a plan view. FIG. 9 shows two dams of the first dam DAM1 and the second dam DAM2. The number of dams of the dam DAM may be changed. The first dam DAM1 and the second dam DAM2 may be disposed between the display area DA of the substrate 100 and the terminal part PAD in a plan view (see FIG. 3). The first and second dams DAM1 and DAM2 may be disposed on the inorganic layer. As an example, the first and second dams DAM1 and DAM2 may be disposed on the inorganic insulating layer including at least one of the buffer layer 110, the first gate insulating layer 111, the second gate insulating layer 112, and the interlayer insulating layer 113.

The first dam DAM1 may be provided in the second sub-peripheral area SPA2. The second dam DAM2 in the second sub-peripheral area SPA2 may be further provided between the first dam DAM1 and the first sub-peripheral area SPA1, wherein the second dam DAM2 is relatively closer to the display area DA than the first dam DAM1.

The first inorganic encapsulation layer 310 and the second inorganic encapsulation layer 330 may each cover the first and second dams DAM1 and DAM2, and be formed to the outside of the first and second dams DAM1 and DAM2. Because the position of the organic encapsulation layer 320 is limited by the first and second dams DAM1 and DAM2, a material for forming the organic encapsulation layer 320 may be prevented from overflowing to the outside of the first and second dams DAM1 and DAM2.

At least a portion of the first and second dams DAM1 and DAM2 may be disposed on the power supply lines, for example, the driving voltage supply line 11 and/or the common voltage supply line 13. The first and second dams DAM1 and DAM2 may extend in the x-direction in the second sub-peripheral area SPA2 below the display area DA. The first and second dams DAM1 and DAM2 may extend in the y-direction in the second sub-peripheral area SPA2 on the left and right of the display area DA. Though not shown, the first and second dams DAM1 and DAM2 may extend in the x-direction in the second sub-peripheral area SPA2 above the display area DA.

Each of the plurality of dams DAM may have a multi-layered structure including a plurality of layers. For the dam DAM to limit the position of the material for forming the organic encapsulation layer 320, it is preferable that the height of the first dam DAM1 arranged in the outermost side is relatively higher than the height of the second dam DAM2. The first dam DAM1 may include a greater number of layers than the second dam DAM2 such that the height of the first dam DAM1 arranged on the outermost side of the display area DA is greater than the height of the second dam DAM2. As an example, the second dam DAM2 may include two layers, that are, a first layer 116D and a second layer 118D, wherein the first layer 116D is a lowermost layer stacked in a direction away from the upper surface of the substrate 100, and the second layer 118D is on the first layer 116D. The first dam DAM1 may include the first layer 116D, the second layer 118D, and a third layer 119D, wherein the first layer 116D is the lowermost layer stacked in the z direction, the second layer 118D is on the first layer 116D, and the third layer 119D is on the second layer 118D.

Each of the plurality of dams DAM may include a plurality of organic insulating layers. As an example, the first layer 116D may be simultaneously formed while the second insulating layer 116 is formed in the display area DA, and the first layer 116D may include the same material as that of the second insulating layer 116. The second layer 118D may be simultaneously formed while the third insulating layer 118 is formed in the display area DA, and the second layer 118D may include the same material as that of the third insulating layer 118. The third layer 119D may be simultaneously formed while the spacer SPC is formed in the display area DA, and the third layer 119D may include the same material as that of the spacer SPC.

As shown in FIG. 9, the auxiliary line 19 may be disposed between the first layer 116D and the second layer 118D of the first and second dams DAM1 and DAM2 to cover the first layer 116D. The hole 19H may be defined in the auxiliary line 19, wherein the hole 19H exposes a portion of the upper surface of the first layer 116D. The hole 19H may serve as an outgassing path that discharges a gas occurring from the first layer 116D to the outside.

In this case, the first control groove CH1 and the second control groove CH2 may be disposed. In this case, the first control groove CH1 may be disposed on the second insulating layer 116. In another embodiment, the first control groove CH1 may be disposed on the third insulating layer 118 as shown in FIG. 5. However, for convenience of description, the case where the first control groove CH1 is disposed in (or on) the second insulating layer 116 is mainly described in detail.

In addition, the second control groove CH2 may be disposed in at least one of the first touch insulating layer TNS1 and the second touch insulating layer TNS2.

The first control groove CH1 and the second control groove CH2 may be configured to adjust the positions of the boundaries of the organic encapsulation layer 320 and the high refractive layer 700. In this case, because the second control groove CH2 disposed in a region F is the same as or similar to that described with reference to FIGS. 5, 8A and 8B, detailed description thereof is omitted. Hereinafter, the first control groove CH1 is described in detail.

Figure 10A:
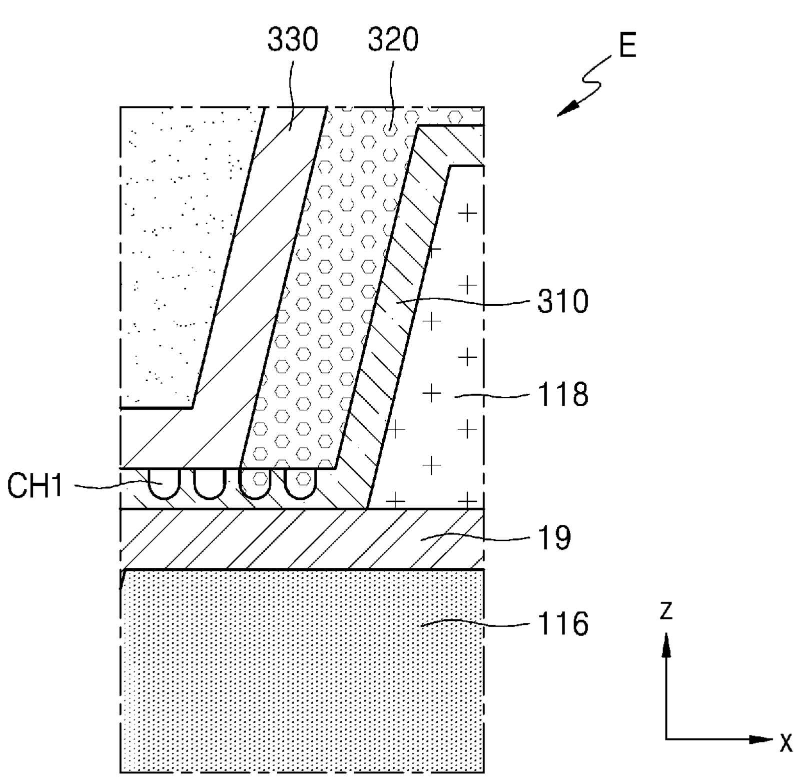
FIGS. 10A, 10B, and 10C are schematic cross-sectional views of a first control groove shown in FIG. 9.
Figure 10B:
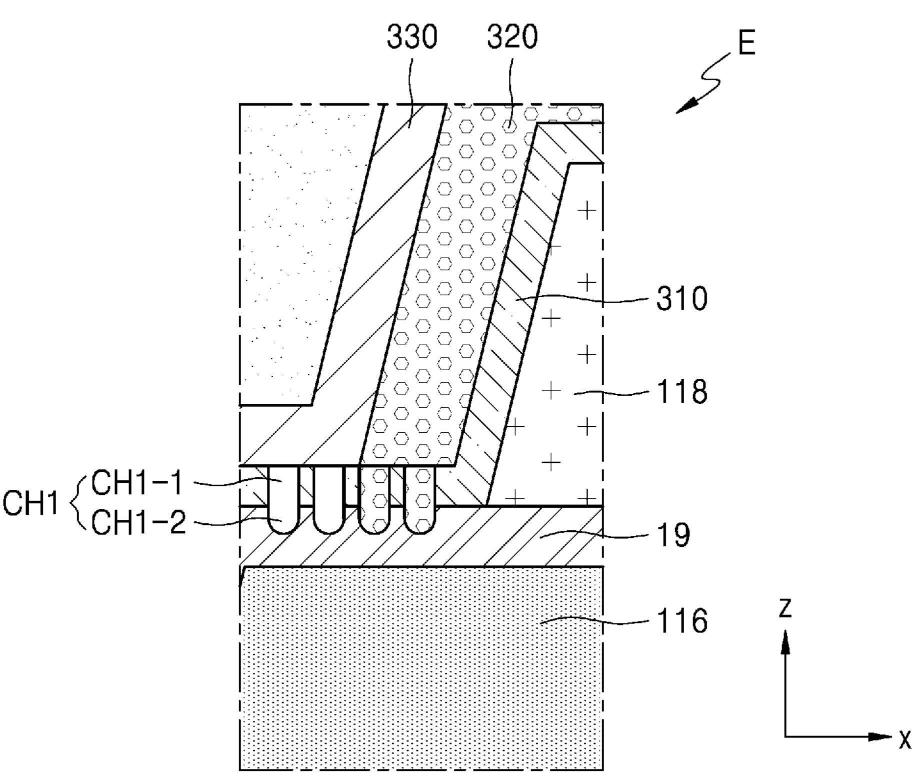
Figure 10C:
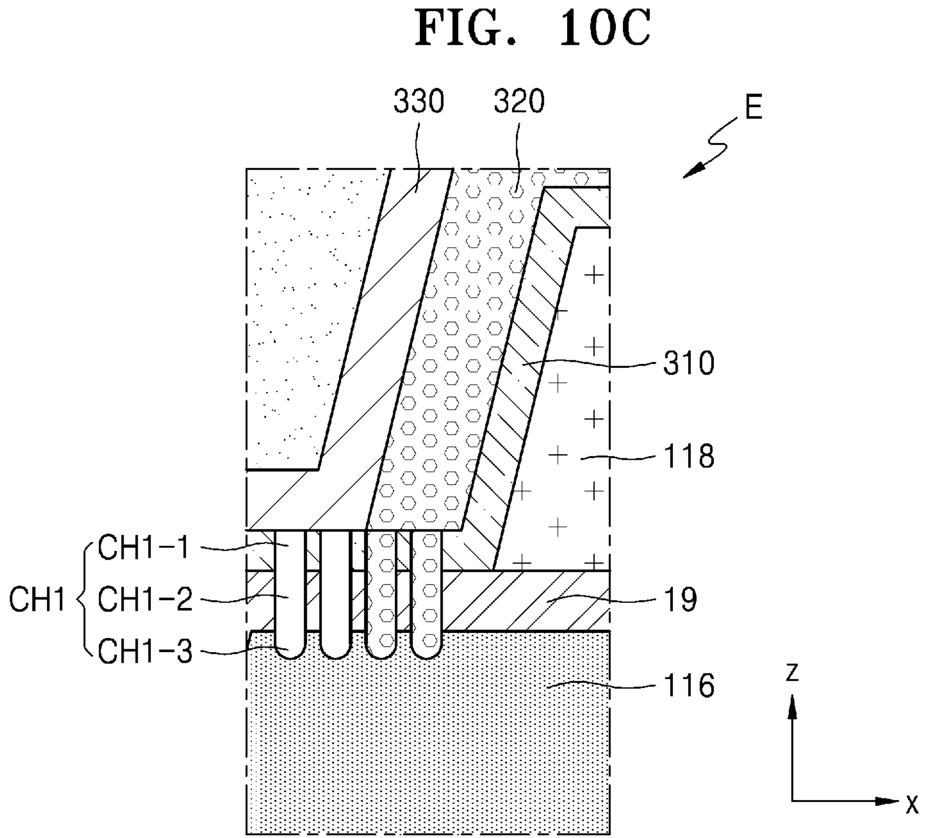

FIGS. 10A, 10B, and 10C are schematic cross-sectional views of the first control groove CH1 shown in FIG. 9. Here, FIGS. 10A, 10B, and 10C are enlarged cross-sectional views of a region E of FIG. 9.

Referring to FIGS. 10A, 10B, and 10C, the first control groove CH1 may be disposed in a plane similarly to that shown in FIGS. 6A, 6B, 6C, 6D, and 6E.

In this case, the first control groove CH1 may be formed in the first inorganic encapsulation layer 310 as shown in FIG. 10A.

The first control groove CH1 may be formed in the first inorganic encapsulation layer 310 and the auxiliary line 19 as shown in FIG. 10B. In this case, the first control groove CH1 may be formed to completely pass through the first inorganic encapsulation layer 310. In addition, the first control groove CH1 may be formed in only a portion of the auxiliary line 19. In another embodiment, though not shown in the drawing, the first control groove CH1 may be formed to pass through both the first inorganic encapsulation layer 310 and the auxiliary line 19. In this case, the first control groove CH1 may be formed in only the first inorganic encapsulation layer 310 and the auxiliary line 19. In this case, the first control groove CH1 may include the (1-1)st part CH1-1 and the (1-2)nd part CH1-2, wherein the (1-1)st part CH1-1 is arranged in the first inorganic encapsulation layer 310, and the (1-2)nd part CH1-2 is arranged in the auxiliary line 19. The (1-1)st part CH1-1 may be connected to the (1-2)nd part CH1-2 to form one first control groove CH1.

In another embodiment, the first control groove CH1 may be formed in each of the first inorganic encapsulation layer 310, the auxiliary line 19, and the second insulating layer 116 as shown in FIG. 10C. In this case, the first control groove CH1 may include the (1-1)st part CH1-1, the (1-2)nd part CH1-2, and a (1-3)rd part CH1-3, wherein the (1-1)st part CH1-1 passes through the first inorganic encapsulation layer 310, the (1-2)nd part CH1-2 passes through the auxiliary line 19, and the (1-3)rd part CH1-3 is formed in the second insulating layer 116. In this case, the (1-1)st part CH1-1, the (1-2)nd part CH1-2, and the (1-3)rd part CH1-3 may be connected to one another.

In this case, a cross-sectional shape of the first control groove CH1 may be various. As an example, the cross-sectional shape of the first control groove CH1 may be a U-shape as shown in FIGS. 10A, 10B, and 10C, a trapezoidal shape as shown in FIG. 7C, and a shape having an inner surface having a step difference as shown in FIG. 7D.

Figure 11A:
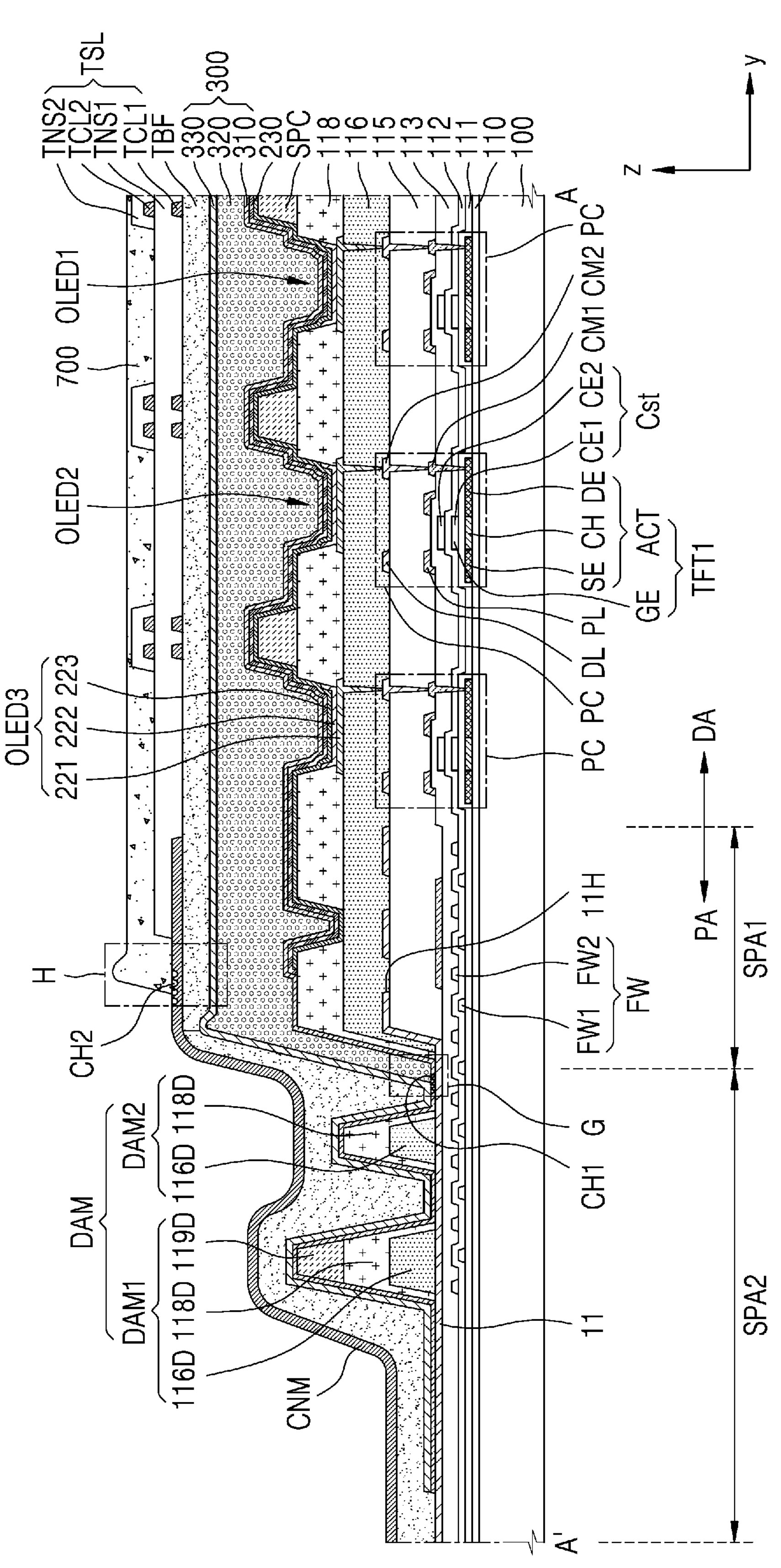
FIG. 11A is a schematic cross-sectional view of a display apparatus taken along line A-A' illustrated in FIG. 3 according to another embodiment.
Figure 11B:
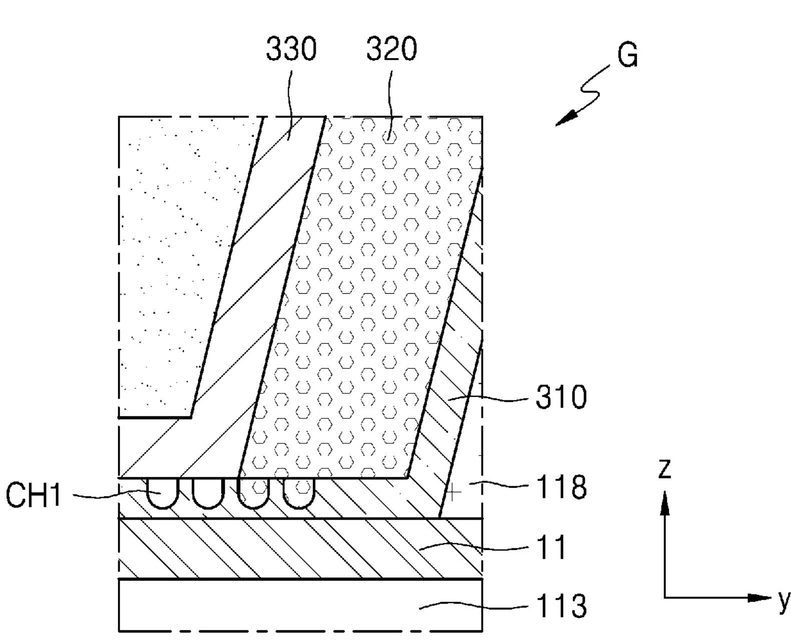
FIGS. 11B, 11C, and 11D are schematic cross-sectional views of a first control groove shown in FIG. 11A.
Figure 11C:
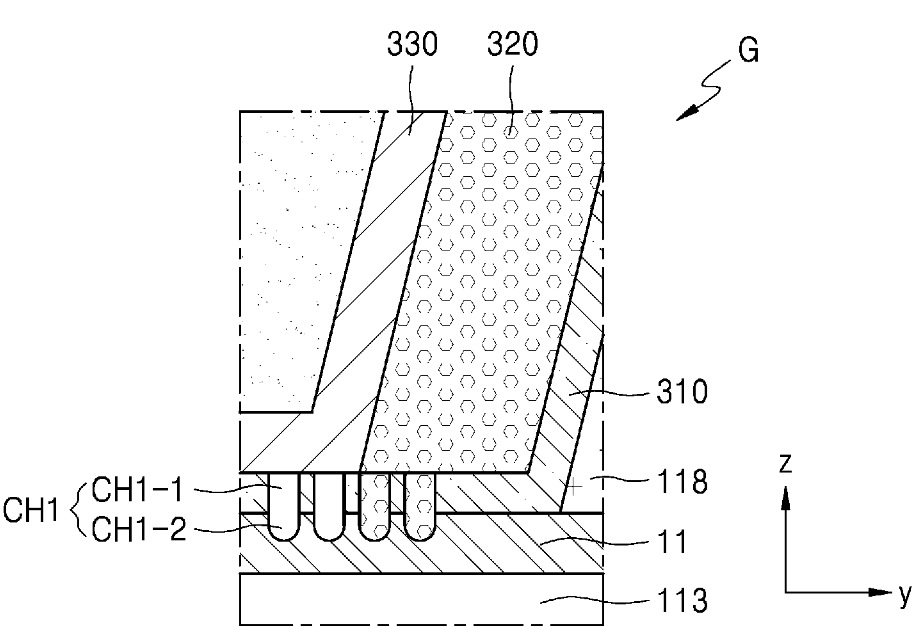
Figure 11D:
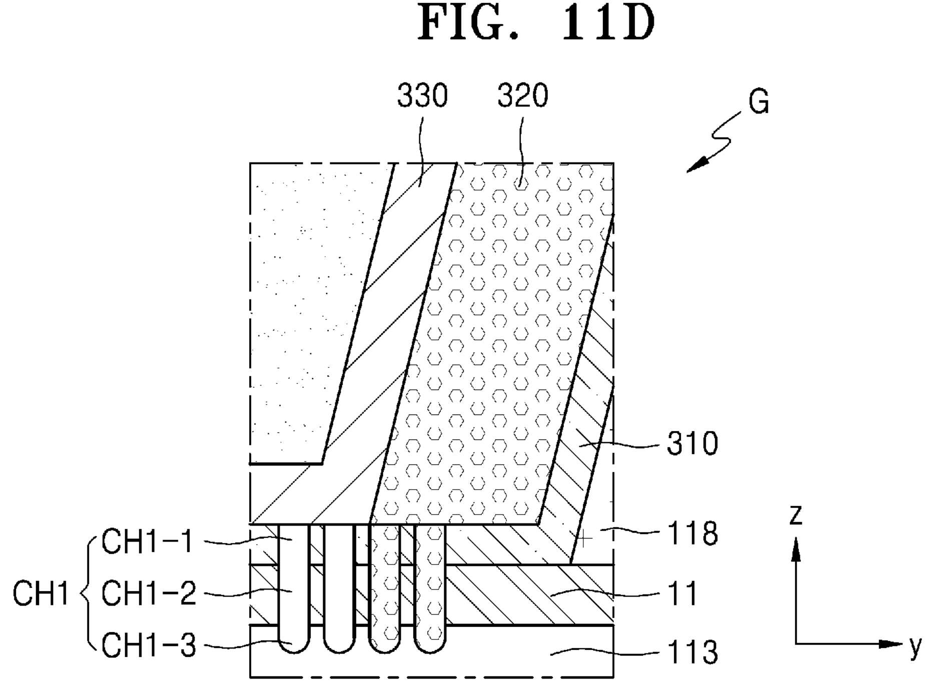

FIG. 11A is a schematic cross-sectional view of a display apparatus taken along line A-A' illustrated in FIG. 3 according to another embodiment. FIGS. 11B, 11C, and 11D are schematic cross-sectional views of the first control groove CH1 shown in FIG. 11A. Here, FIGS. 11B, 11C, and 11D are enlarged cross-sectional views of a region G of FIG. 11A.

Referring to FIGS. 11A, 11B, 11C, and 11D, the display apparatus 1 (e.g., see FIG. 2) may include the display panel 10 (e.g., see FIG. 2) and the input sensing layer 40 (e.g., see FIG. 2). In this case, because the display panel 10 is the same as or similar to that described with reference to FIGS. 3, 4, 5, and 9, detailed description is omitted. In this case, differences from FIGS. 3, 4, 5, and 9 are mainly described in detail.

The first control groove CH1 arranged below the display area DA in FIG. 3 may be disposed between the dam DAM and the third organic light-emitting element OLED3 as shown in FIG. 11A. In another embodiment, the first control groove CH1 may be disposed between the dams DAM adjacent to each other. Hereinafter, for convenience of description, the case where the first control groove CH1 is disposed between the dam DAM and the third organic light-emitting element OLED3 is mainly described in detail.

As shown in FIG. 11A, the first control groove CH1 may be disposed between the end of the third insulating layer 118 and the second dam DAM2. In this case, the first control groove CH1 may be disposed inside of a groove formed by the second insulating layer 116, the third insulating layer 118, and the second dam DAM2. The first control groove CH1 may be provided in plurality to be apart from each other.

The second control groove CH2 may be disposed in the touch wiring CNM. In this case, the second control groove CH2 may be provided in plurality, and the plurality of second control grooves CH2 may be apart from each other.

The first control groove CH1 may limit the position of the end of the organic encapsulation layer 320. In addition, the second control groove CH2 may be configured to control the position of the end of the high refractive layer 700.

Referring to FIG. 11B, the first control groove CH1 may be formed in the first inorganic encapsulation layer 310. In this case, the first control groove CH1 may be formed by removing a portion of the first inorganic encapsulation layer 310 or removing the first inorganic encapsulation layer 310 entirely.

Referring to FIG. 11C, the first control groove CH1 may include the (1-1)st part CH1-1 and the (1-2)st part CH1-2, wherein the (1-1)st part CH1-1 is formed to pass through the first inorganic encapsulation layer 310, and the (1-2)st part CH1-2 is formed by removing at least a portion of the driving voltage supply line 11. In this case, the (1-1)st part CH1-1 may be connected to the (1-2)nd part CH1-2 to form one first control groove CH1.

In this case, the (1-2)st part CH1-2 may be formed to completely pass through the driving voltage supply line 11 as depicted in FIG. 11D.

Referring to FIG. 11D, the first control groove CH1 may include the (1-1)st part CH1-1, the (1-2)st part CH1-2, and the (1-3)rd part CH1-3, wherein the (1-1)st part CH1-1 is formed to pass through the first inorganic encapsulation layer 310, the (1-2)st part CH1-2 is formed to pass through the driving voltage supply line 11, and the (1-3)rd part CH1-3 is formed by removing at least a portion of the interlayer insulating layer 113. In this case, the (1-1)st part CH1-1, the (1-2)nd part CH1-2, and the (1-3)rd part CH1-3 may be connected to one another.

In this case, the first control groove CH1 may have various planar shapes as shown in FIGS. 6A, 6B, 6C, 6D, and 6E, and have various cross-sectional shapes as shown in FIGS. 7A, 7B, 7C, and 7D.

Figure 12A:
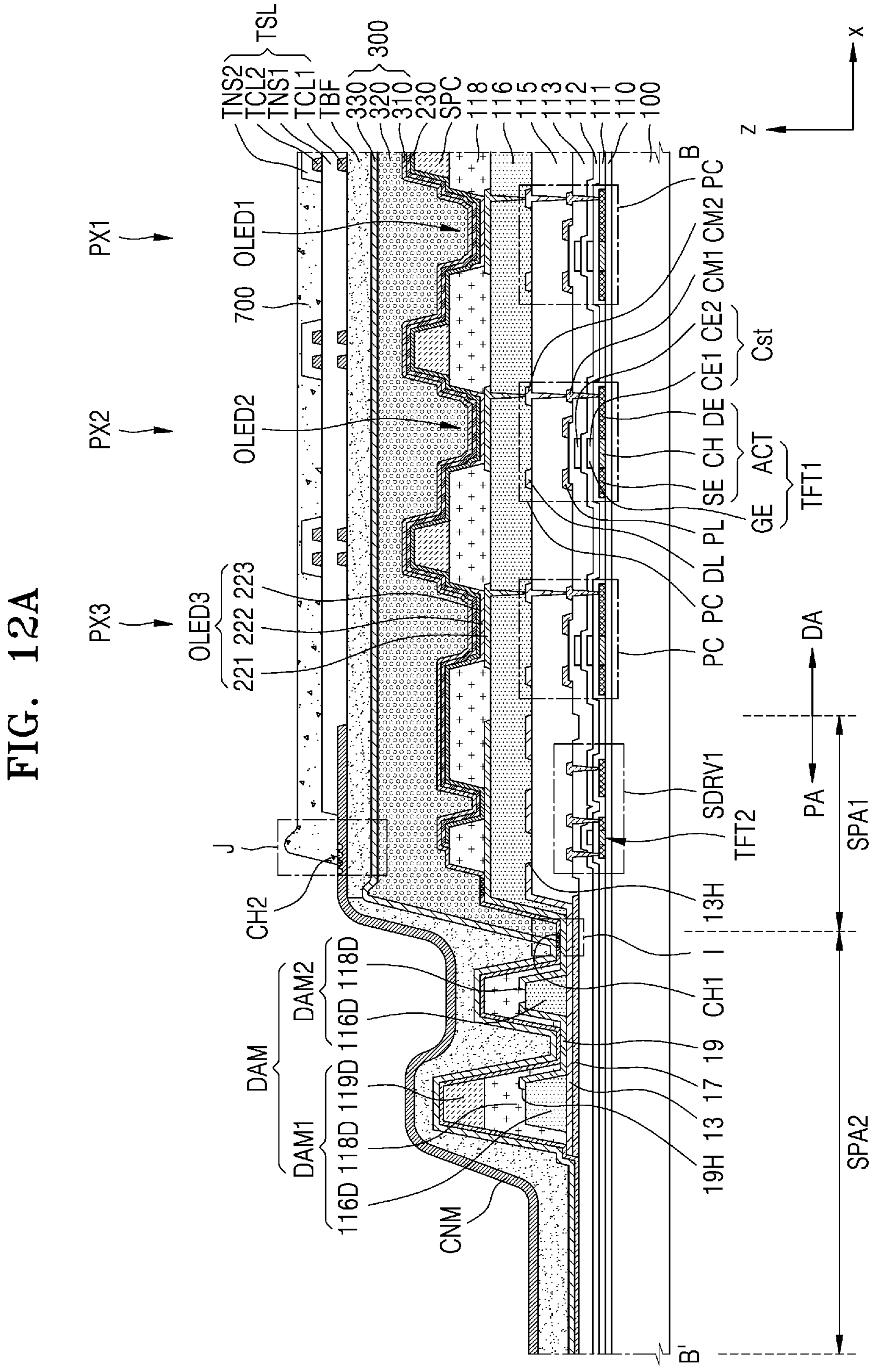
FIG. 12A is a schematic cross-sectional view of a display apparatus taken along line B-B' illustrated in FIG. 3 according to another embodiment.
Figure 12B:
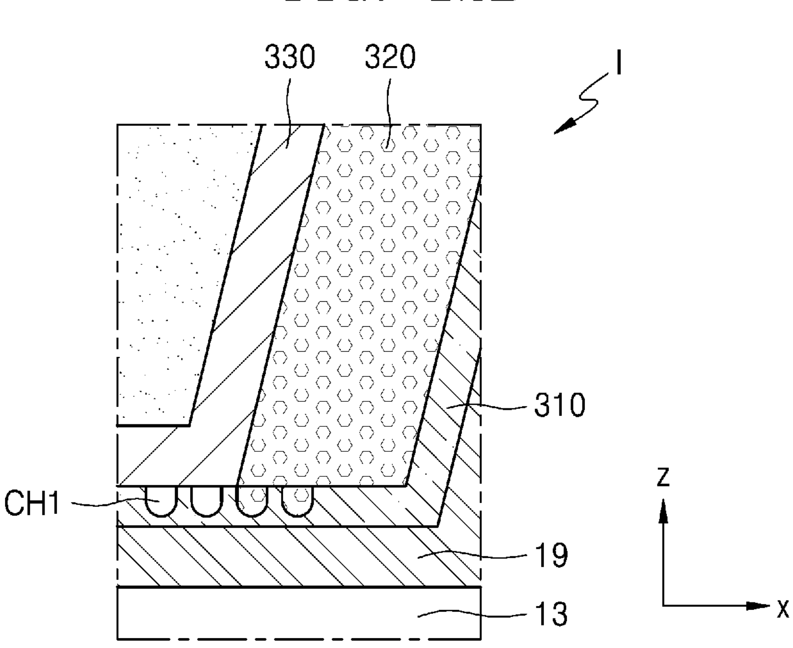
FIGS. 12B, 12C, and 12D are schematic cross-sectional views of a first control groove shown in FIG. 12A.
Figure 12C:
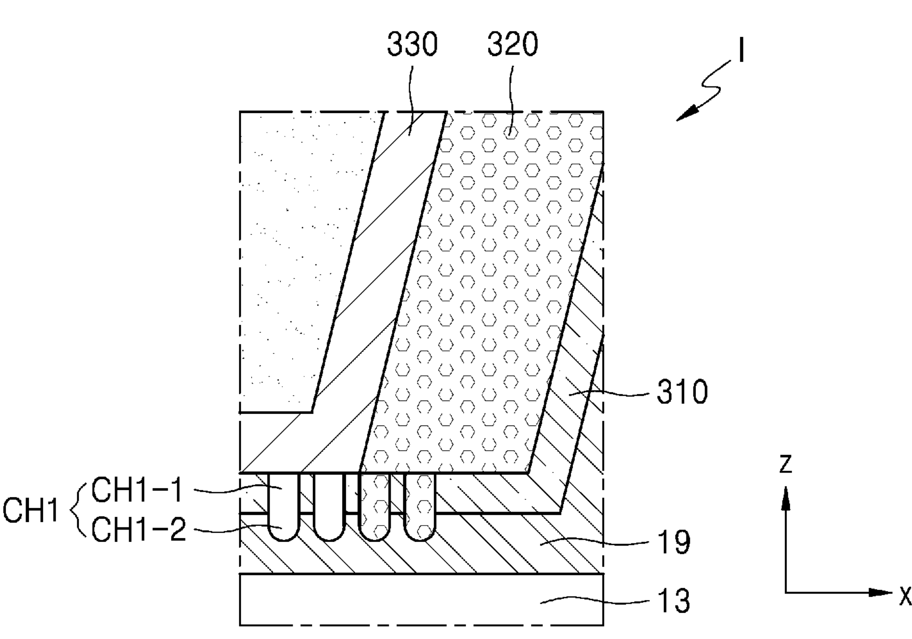
Figure 12D:
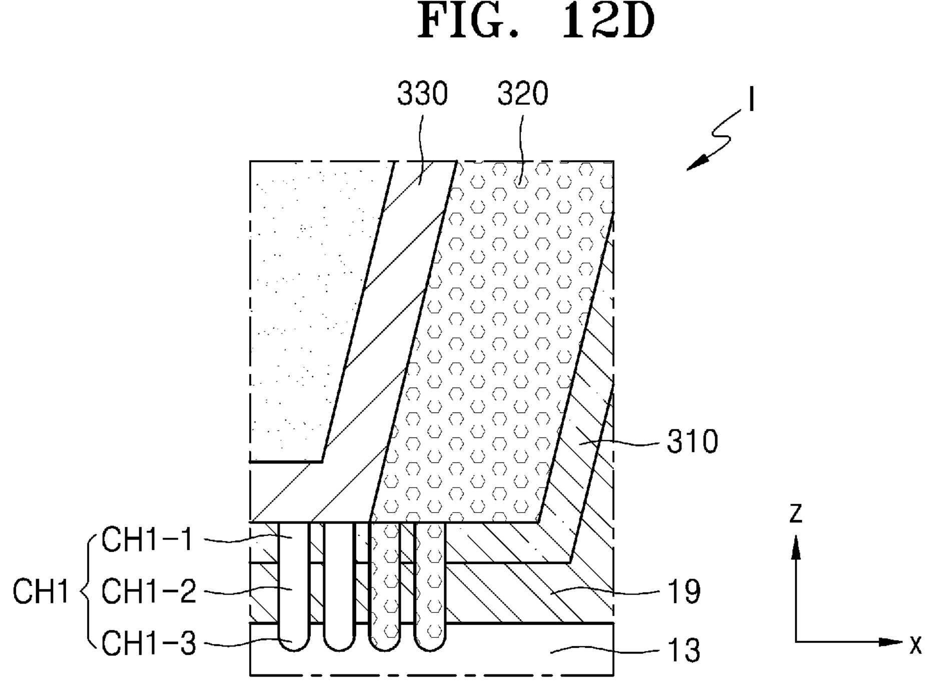

FIG. 12A is a schematic cross-sectional view of a display apparatus taken along line B-B' illustrated in FIG. 3 according to another embodiment. FIGS. 12B, 12C, and 12D are schematic cross-sectional views of the first control groove CH1 shown in FIG. 12A. FIGS. 12B, 12C, and 12D are enlarged cross-sectional views of a region I of FIG. 12A.

Referring to FIGS. 12A, 12B, 12C, and 12D, the display apparatus 1 (e.g., see FIG. 2) may include the display panel 10 (e.g., see FIG. 2) and the input sensing layer 40 (e.g., see FIG. 2). In this case, because the display panel 10 is the same as or similar to that described with reference to FIGS. 3, 4, 5, and 9, detailed description is omitted. In this case, differences from FIGS. 3, 4, 5, and 9 are mainly described in detail.

The first control groove CH1 arranged on one of the lateral surface and the upper surface of the display area DA in FIG. 3 may be disposed between the dam DAM and the third organic light-emitting element OLED3 as shown in FIG. 12A. In this case, the first control groove CH1 may be disposed between the end of the third insulating layer 118 and the second dam DAM2 as shown in FIG. 12A. In this case, the first control groove CH1 may be disposed inside a groove formed by the second insulating layer 116, the third insulating layer 118, and the second dam DAM2. The first control groove CH1 may be provided in plurality to be apart from each other.

The second control groove CH2 may be disposed in the touch wiring CNM. In this case, the second control groove CH2 may be provided in plurality, and the plurality of second control grooves CH2 may be apart from each other.

The first control groove CH1 may limit the position of the end of the organic encapsulation layer 320. In addition, the second control groove CH2 may be configured to control the position of the end of the high refractive layer 700.

Referring to FIG. 12B, the first control groove CH1 may be formed in the first inorganic encapsulation layer 310. In this case, the first control groove CH1 may be provided in plurality and the plurality of first control grooves CH1 may be apart from each other.

Referring to FIG. 12C, the first control groove CH1 may include the (1-1)st part CH1-1 and the (1-2)nd part CH1-2, wherein the (1-1)st part CH1-1 is disposed in the first inorganic encapsulation layer 310, and the (1-2)nd part CH1-2 is disposed in the auxiliary line 19.

Referring to FIG. 12D, the first control groove CH1 may include the (1-1)st part CH1-1, the (1-2)nd part CH1-2, and a (1-3)rd part CH1-3, wherein the (1-1)st part CH1-1 is disposed in the first inorganic encapsulation layer 310, the (1-2)nd part CH1-2 is disposed in the auxiliary line 19, and the (1-3)rd part CH1-3 is disposed in the common voltage supply line 13.

In this case, the first control groove CH1 may have various planar shapes as shown in FIGS. 6A, 6B, 6C, 6D, and 6E, and have various cross-sectional shapes as shown in FIGS. 7A, 7B, 7C, and 7D.

Figure 13A:
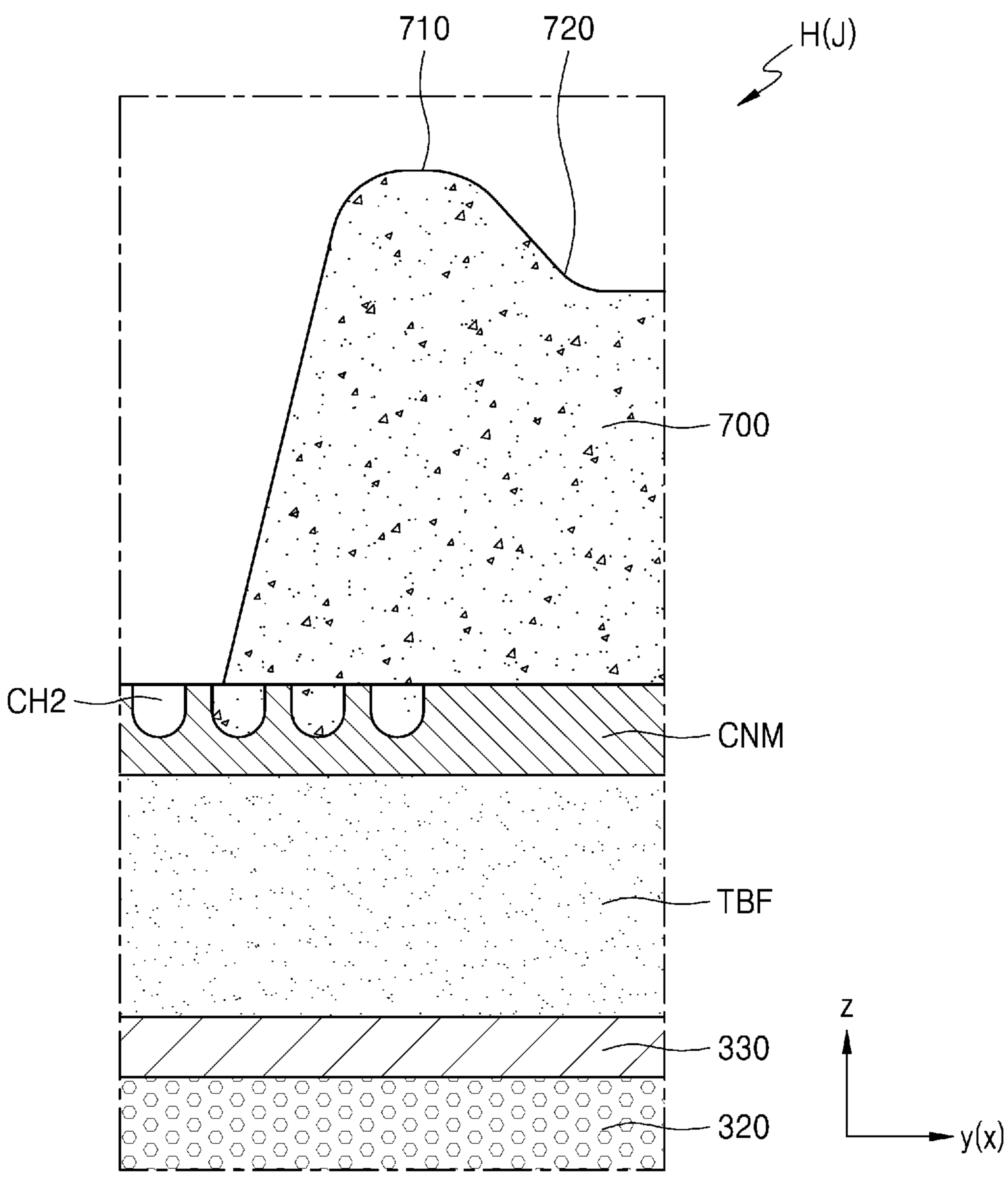
FIGS. 13A, 13B, and 13C are schematic cross-sectional views of a second control groove shown in FIGS. 11A and 12A.
Figure 13B:
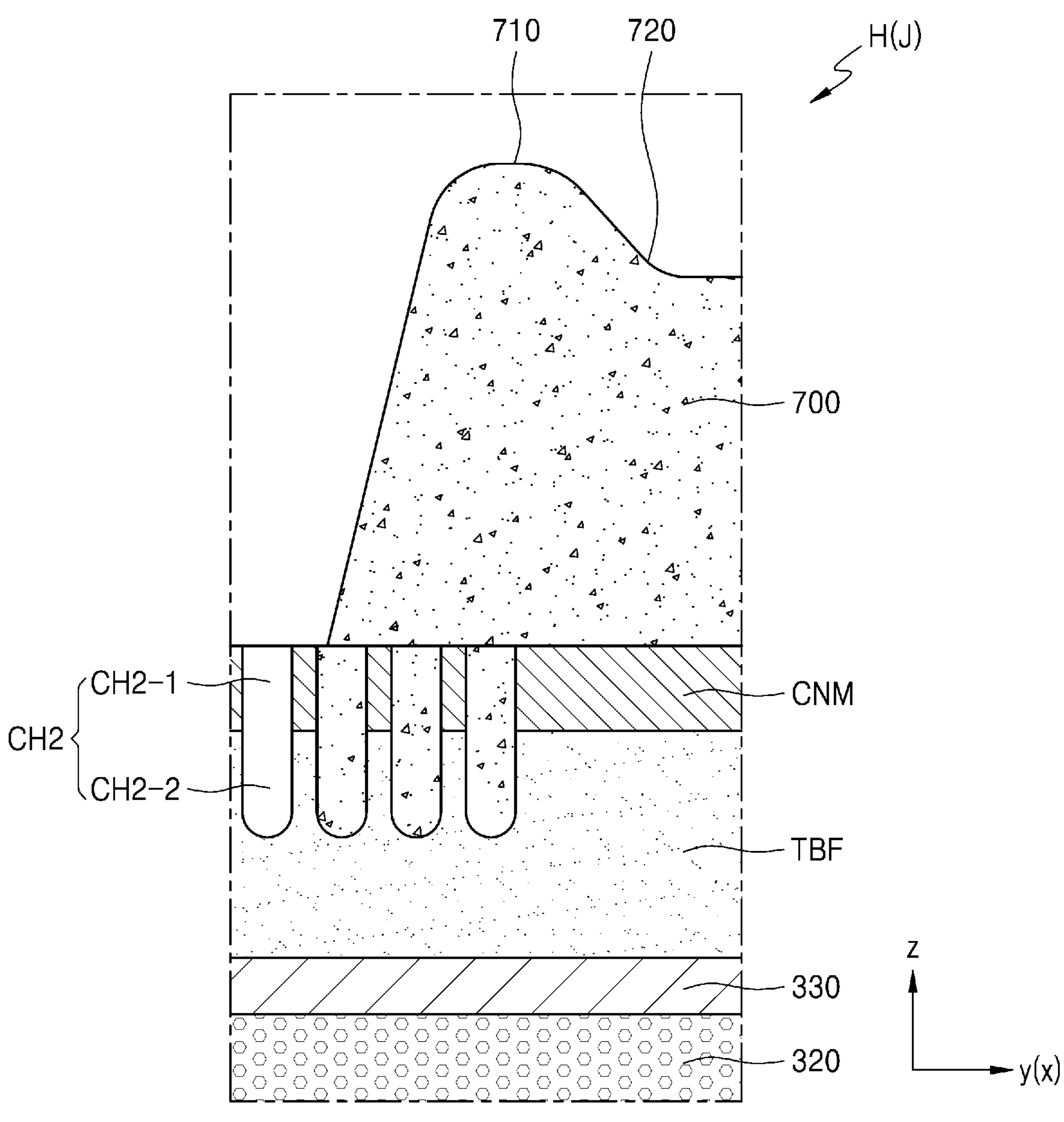
Figure 13C:
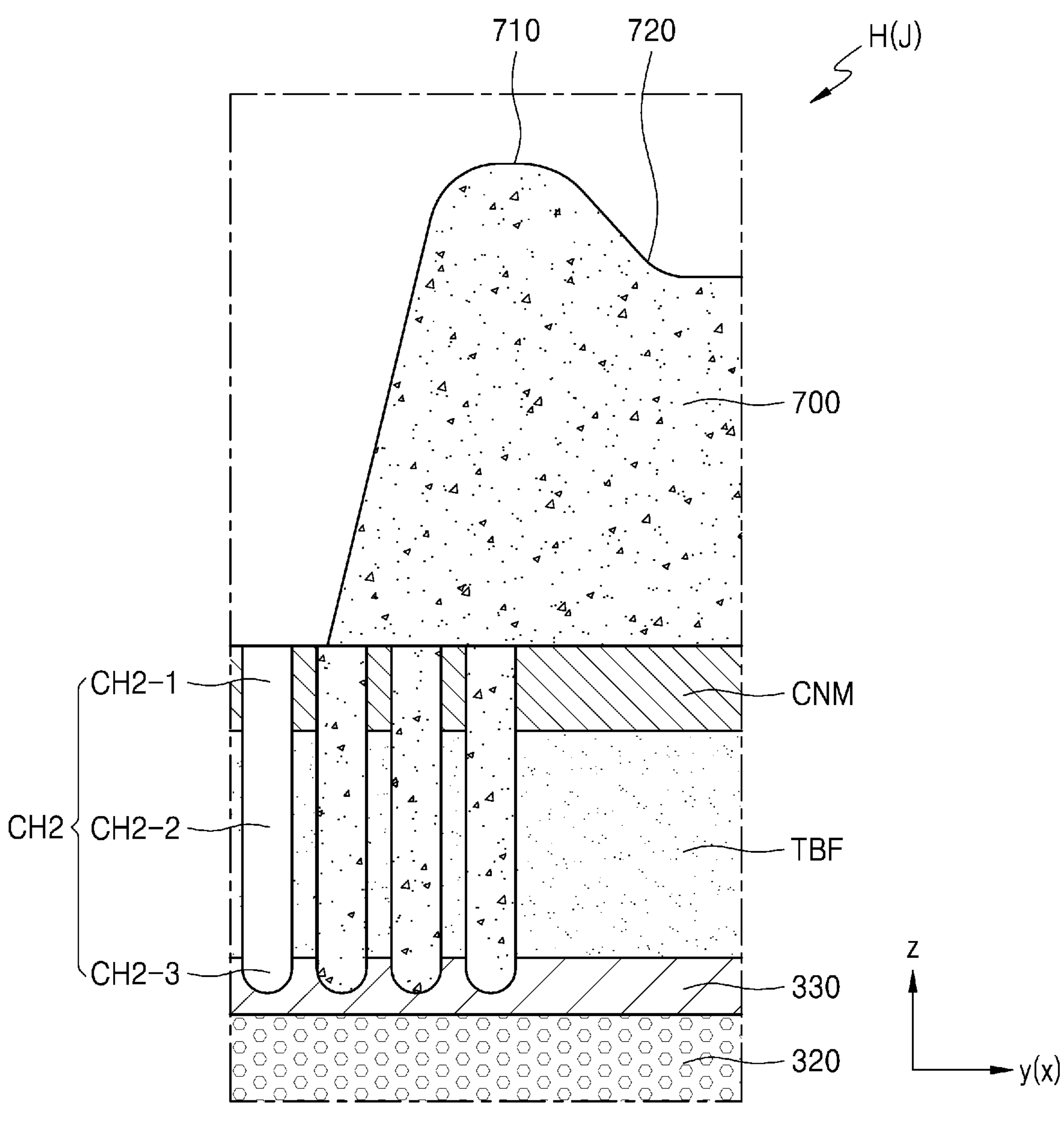

FIGS. 13A, 13B, and 13C are schematic cross-sectional views of a second control groove CH2 shown in FIGS. 11A and 12A. FIGS. 13A, 13B, and 13C are enlarged cross-sectional views of a region H of FIG. 11A and a region J of FIG. 12A.

Referring to FIGS. 13A, 13B, and 13C, the second control groove CH2 may be disposed in at least one of the touch buffer layer TBF, the second inorganic encapsulation layer 330, and the touch wiring CNM. In this case, though not shown in the drawing, the touch wiring CNM may have a structure shielded by the second touch insulating layer TNS2. Hereinafter, for convenience of description, the case where the second touch insulating layer TNS2 is not disposed on the touch wiring CNM, and the second control groove CH2 is formed in the touch wiring CNM is mainly described in detail.

In this case, the second control groove CH2 may be disposed in the touch wiring CNM as shown in FIG. 13A.

In another embodiment, as shown in FIG. 13B, the second control groove CH2 may include a (2-1)st part CH2-1 and a (2-2)nd part CH2-2, wherein the (2-1)st part CH2-1 is disposed in the touch wiring CNM, and the (2-2)nd part CH2-2 is disposed in the touch buffer layer TBF on the dam DAM.

In another embodiment, as shown in FIG. 13C, the second control groove CH2 may include the (2-1)st part CH2-1, the (2-2)nd part CH2-2, and a (2-3)rd part CH2-3, wherein the (2-1)st part CH2-1 is disposed in the touch wiring CNM, the (2-2)nd part CH2-2 is disposed in the touch buffer layer TBF on the dam DAM, and the (2-3)rd part CH2-3 is disposed in the second inorganic encapsulation layer 330.

The second control groove CH2 may have various shapes as shown in FIGS. 6A to 6E, and have various cross-sectional shapes as shown in FIGS. 7A to 7D.

Through this, the second control groove CH2 may be configured not only to control the position of the end of the high refractive layer 700 but to dispose a lowest point 720 of the height of the high refractive layer 700 at a higher position than before by disposing a highest point 710 of the height of the high refractive layer 700 at a higher position than before.

Figure 14A:
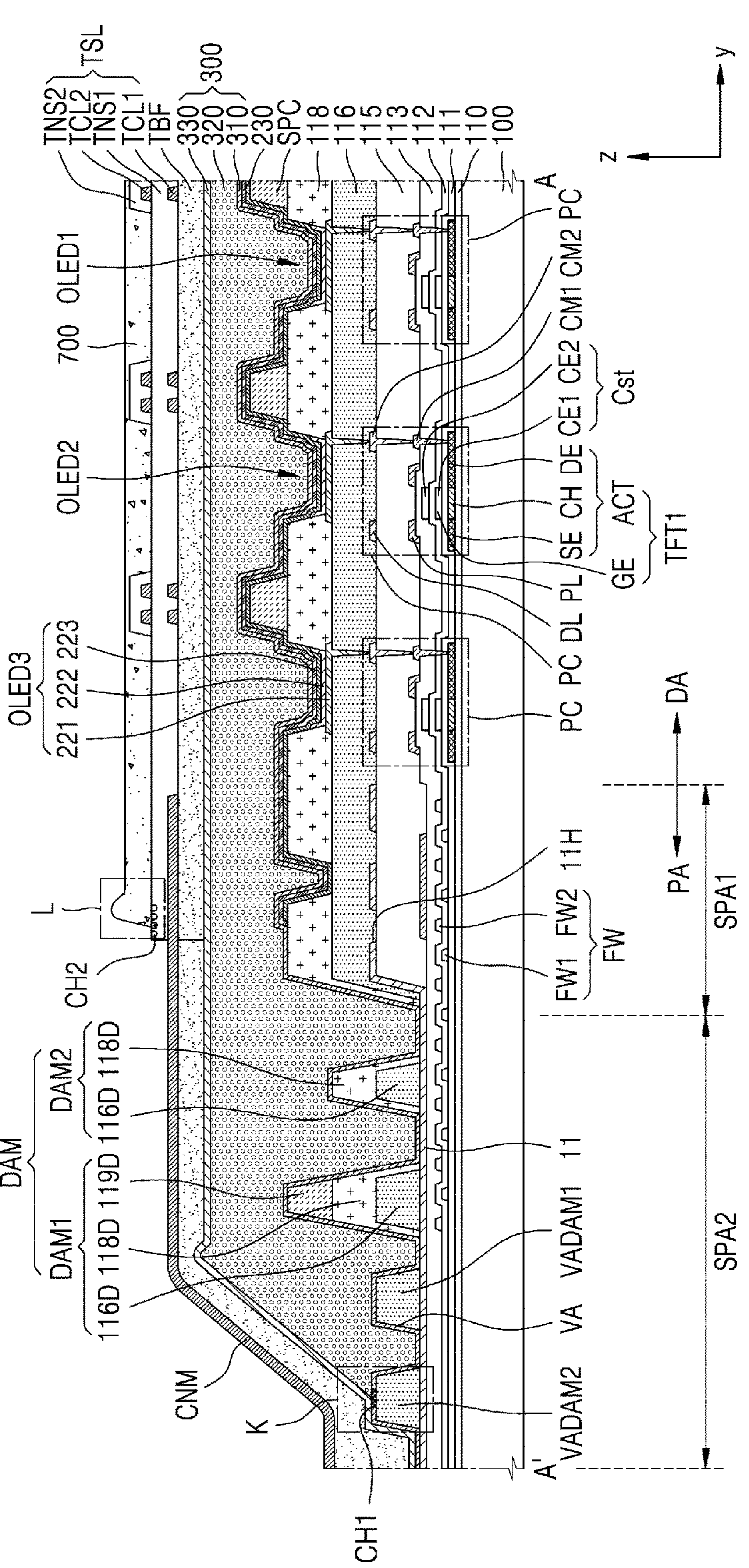
Figure 14B:
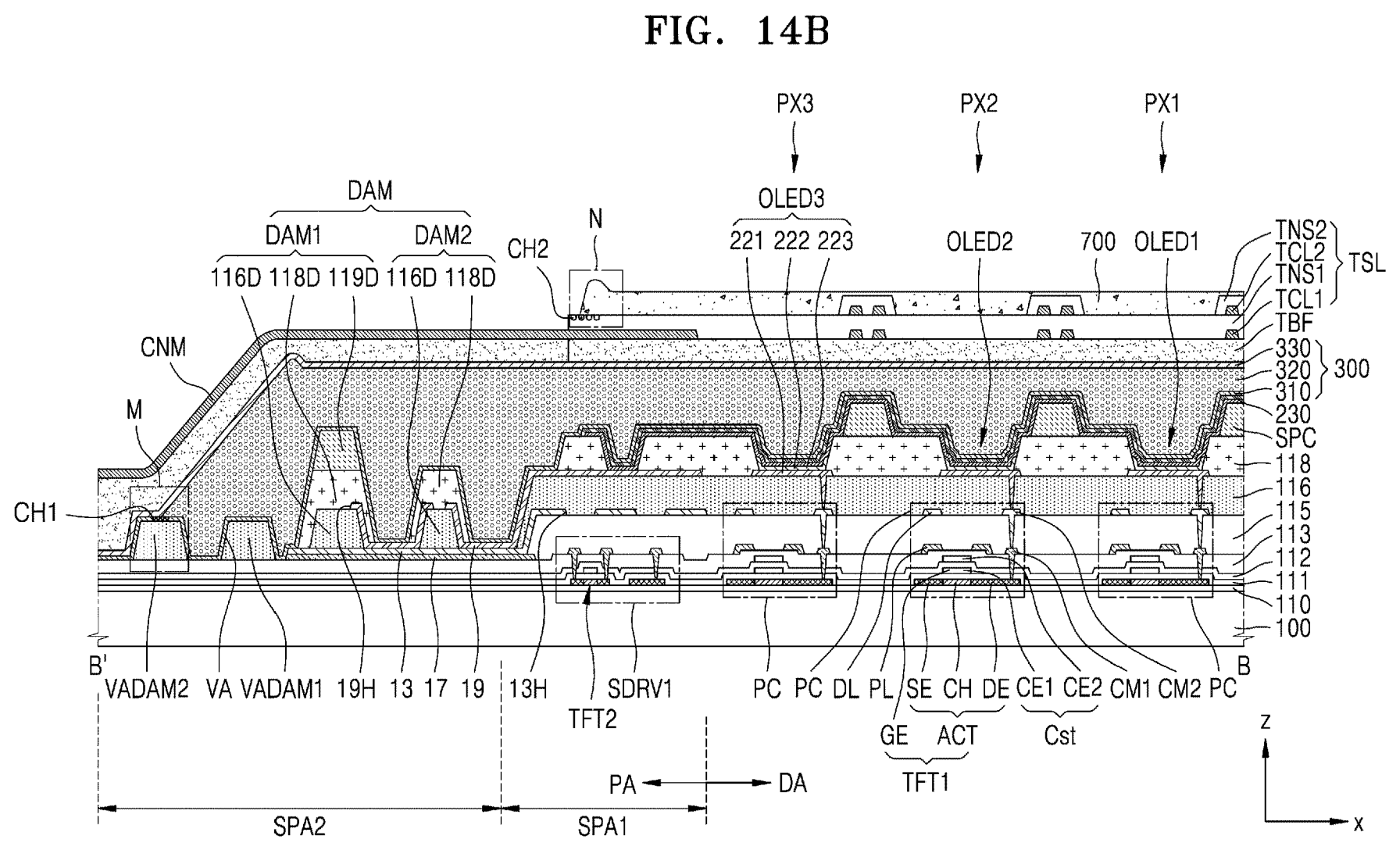
Figure 15A:
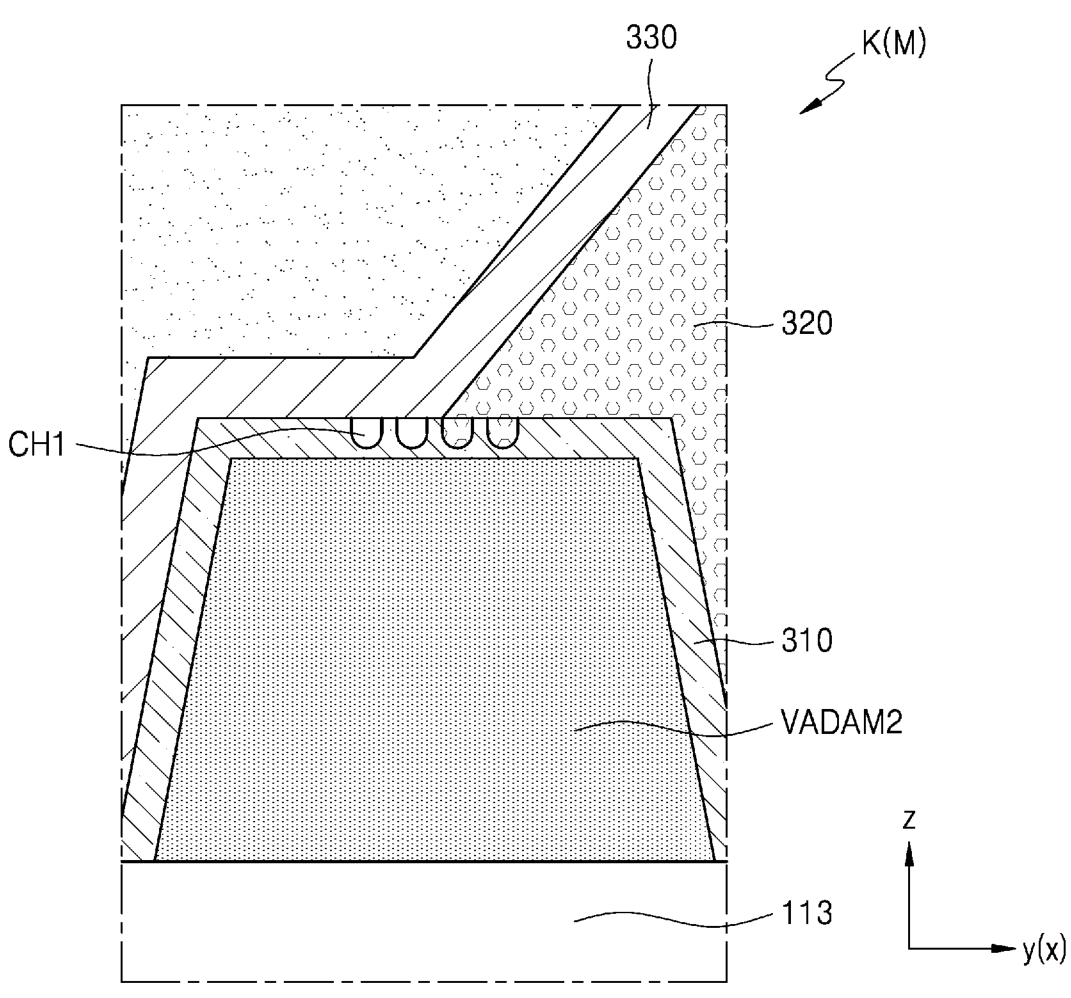
FIGS. 15A and 15B are schematic cross-sectional views of the first control groove shown in FIGS. 14A and 14B.
Figure 15B:
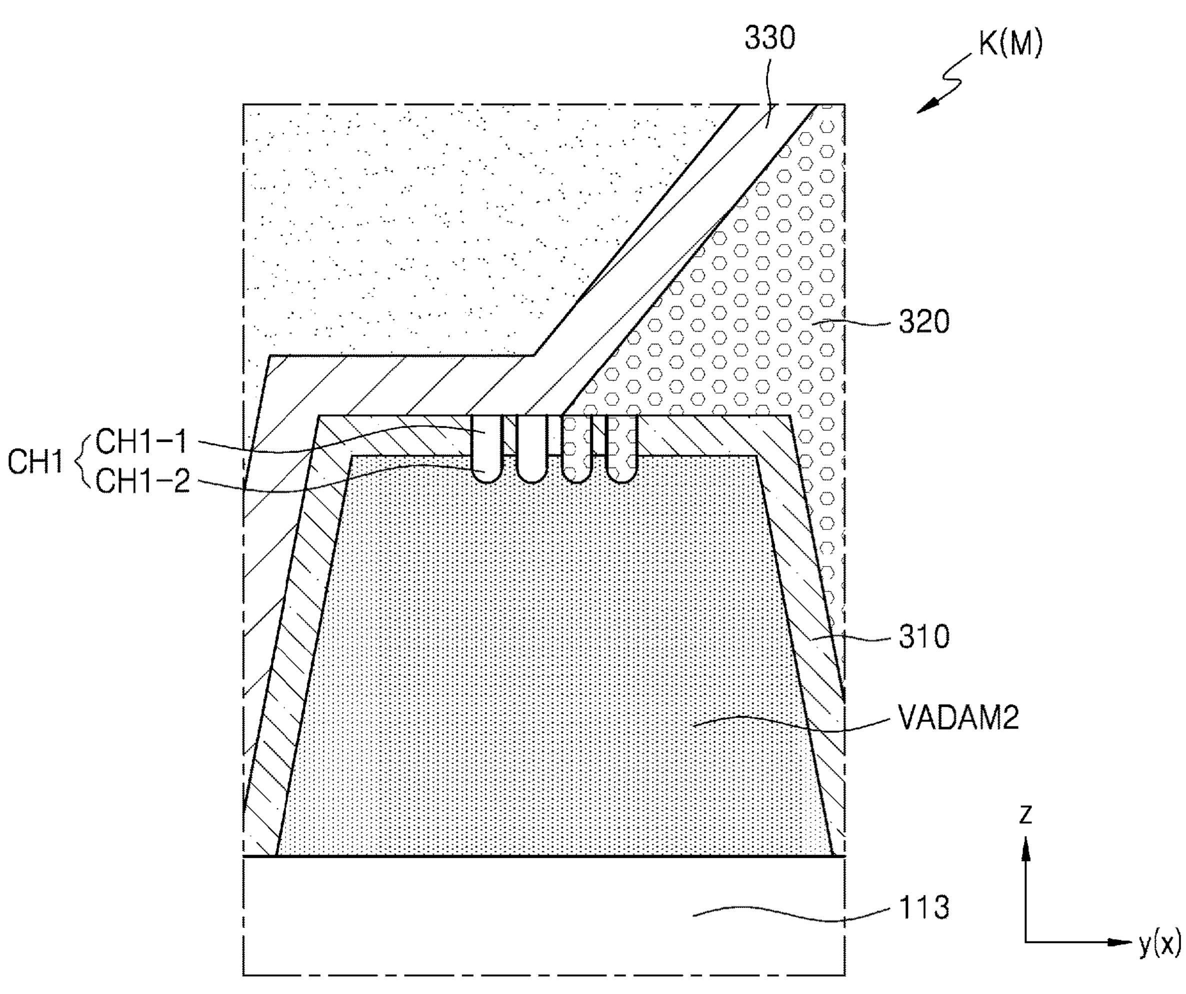

FIGS. 14A and 14B are schematic cross-sectional views of a display apparatus taken along line A-A' and line B-B' illustrated in FIG. 3 according to another embodiment. FIGS. 15A and 15B are schematic cross-sectional views of the first control groove CH1 shown in FIGS. 14A and 14B. Here, FIGS. 15A and 15B are enlarged cross-sectional views of a region K of FIG. 14A and a region M of FIG. 14B.

Referring to FIGS. 14A and 14B, the display panel 10 may further include a valley VA in addition to the dam DAM to limit the position of the end of the organic encapsulation layer 320. In this case, like the dam DAM, the valley VA may form a closed loop and be disposed to surround the outer portion of the display area DA. A valley dam may include a first valley dam VADAM1 and a second valley dam VADAM2 apart from each other. A valley VA may be formed between the first valley dam VADAM1 and the second valley dam VADAM2.

In this case, the first valley dam VADAM1 and the second valley dam VADAM2 may be simultaneously formed while the dam DAM is formed. In this case, the first valley dam VADAM1 and the second valley dam VADAM2 may include the same material as that of at least one of the first layer 116D, the second layer 118D, and the third layer 119D of the dam DAM. Hereinafter, for convenience of description, the case where the first valley dam VADAM1 and the second valley dam VADAM2 include the same material as that of the first layer 116D is mainly described in detail.

Though not shown in the drawing, the valley VA may be disposed between the dam DAM and the display area DA. In another embodiment, the valley VA may be disposed between the dams DAM adjacent to each other. However, for convenience of description, the case where the valley VA is disposed outside the dam DAM is mainly described in detail.

The first control groove CH1 may be disposed at various positions. As an example, as described above, the first control groove CH1 may be disposed in the second insulating layer 116 or the third insulating layer 118, or disposed between the dam DAM and the display area DA. In another embodiment, the first control groove CH1 may be disposed in the valley VA or the valley dam. However, for convenience of description, the case where the first control groove CH1 is disposed in (or on) the second valley dam VADAM2 is mainly described in detail.

Referring to FIG. 15A, the first control groove CH1 may be disposed in the first inorganic encapsulation layer 310 disposed on the second valley dam VADAM2. In another embodiment, referring to FIG. 15B, the first control groove CH1 may include the (1-1)st part CH1-1 and the (1-2)nd part CH1-2, wherein the (1-1)st part CH1-1 is disposed in the first inorganic encapsulation layer 310 disposed on the second valley dam VADAM2, and the (1-2)nd part CH1-2 is disposed in the second valley dam VADAM2.

The first control groove CH1 may limit the position of the end of the organic encapsulation layer 320. Particularly, the valley VA and the dam DAM limit the flowing of the organic encapsulation layer 320 over the display area DA entirely, but the valley VA and the dam DAM do not raise a lowest point 320-1 (e.g., see FIG. 5) of the height of the organic encapsulation layer 320. Accordingly, a stripe pattern and the like may occur after the display panel 10 is manufactured. However, in the case where the plurality of first control grooves CH1 spaced apart from each other are disposed as described above, because the flowing of the organic encapsulation layer 320 is effectively limited, the lowest point 320-1 of the organic encapsulation layer 320 may be maintained at a height nearly similar to that of the flat portion of the organic encapsulation layer 320.

In this case, to control the position of the end of the high refractive layer 700, the second control groove CH2 may be formed. In this case, as described above, the second control groove CH2 may be disposed in the touch wiring CNM or the first touch insulating layer TNS1. In this case, the second control groove CH2 disposed in a region L of FIG. 14A and the second control groove CH2 disposed in a region N of FIG. 14B may have a shape that is same as or similar to that described with reference to FIGS. 5, 8A, and 8B, or FIGS. 13A, 13B and 13C.

Accordingly, the display apparatus 1 may prevent a lowest point of the height of at least one of the organic encapsulation layer 320 and the high refractive layer 700 from being excessively reduced by limiting the position of the end of at least one of the organic encapsulation layer 320 and the high refractive layer 700.

The display apparatus 1 may not only provide clear images but reduce image distortion due to external light by reducing stripe patterns due to external light.

The display apparatus according to embodiments may prevent stripe patterns and the like from being viewed by precisely limiting the position of the end of the organic layer. In addition, the display apparatus according to embodiments may uniformly maintain the height of the organic layer disposed to correspond to the display area by forming a highest point of the organic layer to be high when forming the organic layer.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:

a display substrate including a substrate and a display element disposed over the substrate; and an encapsulation layer disposed on the display substrate and on the display element and including an inorganic encapsulation layer and an organic encapsulation layer, the inorganic encapsulation layer for shielding the display element, wherein a control groove configured to control a position of an end of the organic encapsulation layer is provided in at least one of the inorganic encapsulation layer and an upper surface of the display substrate wherein the control groove extends into the inorganic encapsulation layer in the thickness direction, and wherein the end of the organic encapsulation layer does not overlap the control groove in a thickness direction, or the organic encapsulation layer overlaps at least a portion of the control groove in the thickness direction.

2. The display apparatus of claim 1, wherein the control groove is disposed in an upper surface of at least one of an inorganic layer, an organic layer, and a metal layer of the display substrate.

3. The display apparatus of claim 1, wherein the control groove is provided in plurality, and wherein the plurality of control grooves are arranged to be spaced apart from each other in a first direction and a second direction perpendicular to the first direction in a plan view.

4. The display apparatus of claim 1, wherein the display substrate further includes a dam disposed on the substrate.

5. The display apparatus of claim 4, wherein the control groove is disposed inside of the dam, or the dam is disposed inside of the control groove.

6. The display apparatus of claim 1, wherein a planar shape of the control groove is one of a circular shape, an elliptical shape, and a polygonal shape.

7. The display apparatus of claim 1, wherein the control groove is provided in plurality, and wherein a planar shape of some of the plurality of control grooves is different from a planar shape of an other control grooves.

8. The display apparatus of claim 1, wherein the control groove is provided in plurality, and wherein a lateral surface of some of the plurality of control grooves is different from a lateral surface of others of the plurality of control grooves.

9. The display apparatus of claim 1, wherein a lateral surface of the control groove is inclined.

10. The display apparatus of claim 1, wherein a lateral surface of the control groove has a step difference.

11. The display apparatus of claim 1, wherein a maximum width of the control groove passing through a center of the control groove is about 100 μm or less.

12. The display apparatus of claim 1, wherein the control groove is in different layers in the thickness direction.

13. A display apparatus comprising:

a substrate;

a display element disposed over the substrate;

an encapsulation layer disposed on the display element and shielding the display element;

a touch layer disposed on the encapsulation layer and receiving an external signal; and a refractive layer disposed on the touch layer and configured to refract light emitted from the display element, wherein a control groove configured to control a position of an end of the refractive layer is provided in an upper surface of the touch layer, wherein the control groove extends into the upper surface of the touch layer in the thickness direction, and wherein the end of the refractive layer does not overlap the control groove in a thickness direction, or the refractive layer overlaps at least a portion of the control groove in the thickness direction.

14. The display apparatus of claim 13, wherein the control groove is provided in plurality, and wherein the plurality of control grooves are arranged to be spaced apart from each other in a first direction and a second direction perpendicular to the first direction in a plan view.

15. The display apparatus of claim 13, wherein a planar shape of the control groove is one of a circular shape, an elliptical shape, and a polygonal shape.

16. The display apparatus of claim 13, wherein the control groove is provided in plurality, and wherein a planar shape of some of the plurality of control grooves is different from a planar shape of others of the plurality of control grooves.

17. The display apparatus of claim 13, wherein the control groove is provided in plurality, and wherein a lateral surface of some of the plurality of control grooves is different from a lateral surface of others of the plurality of control grooves.

18. The display apparatus of claim 13, wherein a lateral surface of the control groove is inclined.

19. The display apparatus of claim 13, wherein a lateral surface of the control groove has a step difference.

20. The display apparatus of claim 13, wherein a maximum width of the control groove passing through a center of the control groove is about 100 μm or less.

* * * * *